United States Patent
Carman

(10) Patent No.: US 10,083,733 B2
(45) Date of Patent: Sep. 25, 2018

(54) FERROELECTRIC MEMORY CELL APPARATUSES AND METHODS OF OPERATING FERROELECTRIC MEMORY CELLS

(71) Applicant: Micron Technology, Inc., Boise, ID (US)

(72) Inventor: Eric Carman, San Francisco, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/689,211

(22) Filed: Aug. 29, 2017

(65) Prior Publication Data

US 2018/0005683 A1    Jan. 4, 2018

Related U.S. Application Data

(62) Division of application No. 15/071,991, filed on Mar. 16, 2016, now Pat. No. 9,767,880.

(51) Int. Cl.
*G11C 11/56* (2006.01)
*G11C 11/22* (2006.01)

(52) U.S. Cl.
CPC ........ *G11C 11/2275* (2013.01); *G11C 11/221* (2013.01); *G11C 11/2293* (2013.01)

(58) Field of Classification Search
CPC ............ G11C 11/2275; G11C 11/5657; G11C 14/0027; G11C 14/0072
See application file for complete search history.

(56) References Cited

U.S. PATENT DOCUMENTS

| | | | |
|---|---|---|---|
| 6,611,450 B2 | 8/2003 | Oowaki et al. | |
| 7,203,092 B2* | 4/2007 | Nazarian | G11C 16/0483 365/185.11 |
| 7,724,560 B2 | 5/2010 | Kang et al. | |
| 8,611,136 B2 | 12/2013 | Hush | |
| 9,466,363 B2 | 10/2016 | Endoh et al. | |
| 2002/0122328 A1* | 9/2002 | Oowaki | G11C 11/22 365/145 |
| 2005/0248974 A1* | 11/2005 | Kang | G11C 11/22 365/145 |
| 2011/0058403 A1* | 3/2011 | Hashimoto | G11C 11/22 365/145 |

* cited by examiner

*Primary Examiner* — Khamdan Alrobaie
(74) *Attorney, Agent, or Firm* — Holland & Hart LLP

(57) ABSTRACT

Methods, systems, and devices for operating a ferroelectric memory cell or cells are described. Prior to writing a logic value to a ferroelectric memory cell, a digit line of a ferroelectric memory cell may be biased to a first voltage, and a cell plate of the ferroelectric memory cell may be biased to a second voltage. A magnitude of a difference between the first voltage and the second voltage may be greater than a magnitude of a write voltage for the first ferroelectric memory cell. The magnitude of the difference between the first voltage and the second voltage may decrease the time to reach a write voltage for the ferroelectric memory cell. Several example cell plate drivers are also disclosed.

20 Claims, 12 Drawing Sheets

FERROELECTRIC MEMORY CELL APPARATUSES AND METHODS OF OPERATING FERROELECTRIC MEMORY CELLS

CROSS REFERENCE

The present application for Patent is a divisional of U.S. patent application Ser. No. 15/071,991 by Carman, entitled "Ferroelectric Memory Cell Apparatuses and Methods of Operating Ferroelectric Memory Cells," filed Mar. 16, 2016, assigned to the assignee hereof, and is expressly incorporated by reference in its entirety herein.

BACKGROUND

The following relates generally to memory devices, and more specifically to ferroelectric memory cell apparatuses and methods of operating ferroelectric memory cells.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while certain aspects of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. FeRAM performance may be further improved by increasing the speed at which data is read from the capacitors used in an FeRAM array.

BRIEF DESCRIPTION OF THE DRAWINGS

Embodiments of the disclosure are described with reference to the following figures.

DETAILED DESCRIPTION

Figure 1:
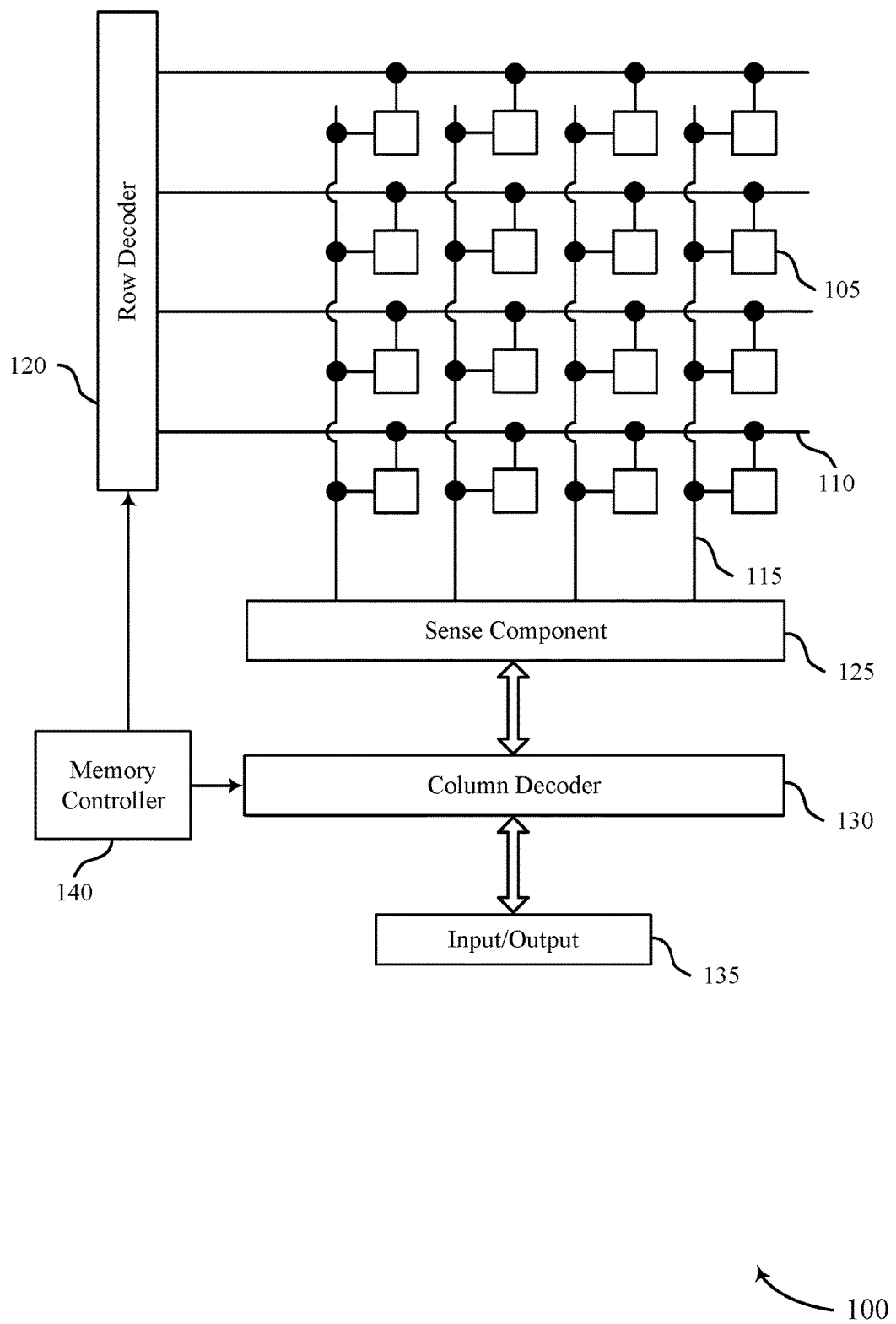
FIG. 1 illustrates an example memory array, in accordance with various embodiments of the present disclosure.

The write speed of a ferroelectric memory cell may be increased by biasing a cell plate of the ferroelectric memory cell to a voltage lower than a voltage needed to achieve a write voltage for the ferroelectric memory cell. The lower voltage to which the cell plate is biased may be provided by a cell plate driver having one or more modifications (or operated differently than) conventional cell plate drivers.

Memory cells within a memory array, including ferroelectric memory cells within a memory array, may be accessed by applying voltages to a word line and a digit line. Access may include writing to a cell (e.g., storing a logic state or value) or reading a cell (e.g., reading a stored logic state or value). Each cell may have a ferroelectric capacitor, or other storage component, that is used to store a logic value of the cell. A single digit line may connect multiple memory cells and may be connected to a sense amplifier that, when activated during a read operation, may be used to determine the stored logic state of a memory cell. For example, an activated sense amplifier may compare the signal (e.g., voltage) extracted from the cell to a reference signal.

When writing a logic state or value to a ferroelectric memory cell, one terminal of a ferroelectric capacitor may be driven to a first voltage (e.g., a high voltage), and the other terminal of the ferroelectric capacitor may be driven to a second voltage (e.g., a low voltage, lower than the high voltage). For example, to write a logic 1, the digit line associated with the ferroelectric memory cell may be driven low while the cell plate of the ferroelectric capacitor associated with the ferroelectric memory cell is driven high. Conversely, to write a logic 0, the digit line may be driven high while the cell plate is driven low. Because of RC coupling between the digit line and the cell plate, driving the cell plate to a low voltage while the digit line is at a high voltage can temporarily pull the digit line low, and can cause the cell plate to reach the low voltage (and cause the digit line to return to the high voltage) in an asymptotic manner. While the cell plate is moving toward the low voltage and/or the digit line is moving toward the high voltage, the voltage across the ferroelectric capacitor is less than a write voltage. Techniques described in the present disclosure can increase the rates at which the digit line and cell plate reach their respective voltages. For example, prior to writing a logic 0 to a ferroelectric memory cell, a cell plate of the ferroelectric memory cell may be biased, at least temporarily, to a voltage lower than a voltage needed to achieve a write voltage for the ferroelectric memory cell. This can increase the rate at which a logic 0 write voltage is reached for the ferroelectric memory cell.

Aspects of the disclosure introduced above are further described below in the context of a memory device. Specific examples of a hybrid memory are then described. These and other aspects of the disclosure are further illustrated by and described with reference to apparatus diagrams, system diagrams, and flowcharts that relate to the configuration, operation, and use of a hybrid memory.

FIG. 1 illustrates an example memory array 100, in accordance with various embodiments of the present disclosure. Memory array 100 may include memory cells 105 that are programmable to store different states. Each memory cell 105 may be programmable to store two states, denoted a logic 0 and a logic 1. In some cases, a memory cell 105 may be configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Ferroelectric materials have non-linear polarization properties.

Operations such as reading and writing may be performed on memory cells 105 by activating or selecting the appropriate word line 110 and digit line 115. Activating or selecting a word line 110 or a digit line 115 may include applying a voltage potential to the respective line. In some cases, a digit line 115 may be referred to as a bit line. Word lines 110 and digit lines 115 may be made of conductive materials. In some examples, word lines 110 and digit lines 115 are made of metals (e.g., copper, aluminum, gold, tungsten, etc.). Each row of memory cells 105 is connected to a single word line 110, and each column of memory cells 105 is connected to a single digit line 115. By activating one word line 110 and one digit line 115, a single memory cell 105 may be accessed at their intersection. The intersection of a word line 110 and a digit line 115 may be referred to as an address of a memory cell.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. Thus, by activating a word line 110 and a digit line 115, a memory cell 105 may be accessed.

Upon accessing, a memory cell 105 may be read, or sensed, by sense component 125. For example, sense component 125 may compare a signal, e.g., a voltage, of the relevant digit line 115 to a reference signal (not shown) in order to determine the stored state of the memory cell 105. For example, if digit line 115 has a higher voltage than the reference voltage, then sense component 125 may determine that the stored state in memory cell 105 is a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by similarly activating the relevant word line 110 and digit line 115. As discussed above, activating a word line 110 electrically connects the corresponding row of memory cells 105 to its respective digit lines 115. By controlling the relevant digit line 115 while the word line 110 is activated, a memory cell 105 may be written—i.e., a logic value may be stored in the memory cell 105. The column decoder 130 may accept data, for example input 135, to be written to the memory cells 105. In the case of a ferroelectric capacitor, a memory cell 105 is written by applying a voltage across the ferroelectric capacitor.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. An advantage of a ferroelectric memory cell is that it may be constructed and/or operated similarly to a DRAM memory cell, but provide non-volatile operation. A ferroelectric memory cell may also be associated with faster write speeds and lower power operation compared to a DRAM memory cell.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells may have beneficial properties that may result in improved performance relative to other memory architectures.

The memory controller 140 may control the operation (read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
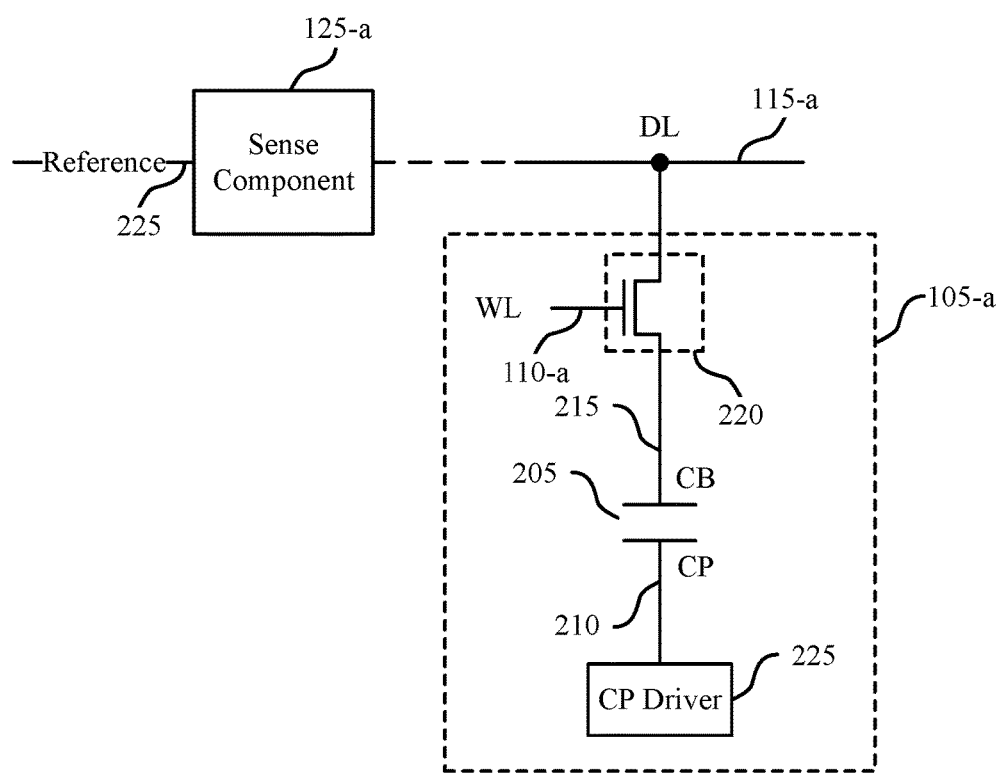
FIG. 2 illustrates an example electronic memory apparatus, in accordance with various embodiments of the present disclosure.

FIG. 2 illustrates an example electronic memory apparatus 200, in accordance with various embodiments of the present disclosure. The electronic memory apparatus 200 may include a ferroelectric memory cell 105-a, word line 110-a, digit line 115-a, and sense component 125-a, which may be examples of a memory cell 105, word line 110, digit line 115, and sense component 125, respectively, as described with reference to FIG. 1. The electronic memory apparatus 200 may include a logic storage component, such as capacitor 205 that includes two conductive terminals, a cell plate (CP) 210 and cell bottom (CB) 215. These terminals may be separated by an insulating ferroelectric material. As described above, various states may be stored by charging or discharging capacitor 205.

The stored state of capacitor 205 may be read or sensed by operating various elements represented in the electronic memory apparatus 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated. In some cases, selection component 220 may be a transistor (e.g., an NMOS transistor) and its operation may be controlled by applying a voltage to the transistor gate, where the voltage magnitude is greater than the threshold magnitude of the transistor. Word line 110-a may activate selection component 220; for example, a voltage applied to word line 110-a may be applied to the transistor gate, connecting capacitor 205 with digit line 115-a.

In the example depicted in FIG. 2, capacitor 205 is a ferroelectric capacitor. Due to the ferroelectric material between the plates of capacitor 205, capacitor 205 may not discharge upon connection to digit line 115-a. Instead, cell plate 210 may be biased by an external voltage, resulting in a change in the stored charge on capacitor 205. The change in stored charge depends on the initial state of capacitor 205, i.e., if the initial state stored a logic 1 or a logic 0. The change in stored charge may then be compared to a reference (e.g., a reference voltage) by sense component 125-a in order to determine the stored logic state in memory cell 105-a.

The specific sensing scheme or process may take many forms. In one example, digit line 115-a may have an intrinsic capacitance and develop a non-zero voltage as capacitor 205 charges or discharges in response to the voltage applied to cell plate 210. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of pF). The subsequent voltage of digit line 115-a may depend on the initial logic state of capacitor 205, and sense component 125-a may compare this voltage to a reference voltage.

To write memory cell 105-a, a voltage potential may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 210 and cell bottom 215 through digit line 115-a and cell plate (CP) driver 225. To write a logic 1, cell plate 210 may be driven high, that is, a positive voltage may be applied, and cell bottom 215 may be driven low, i.e., connected to ground, virtually grounded, or a negative voltage may be applied. The opposite may be performed to write a logic 0, i.e., cell plate 210 may be driven low and cell bottom 215 may be driven high.

Figure 3A:
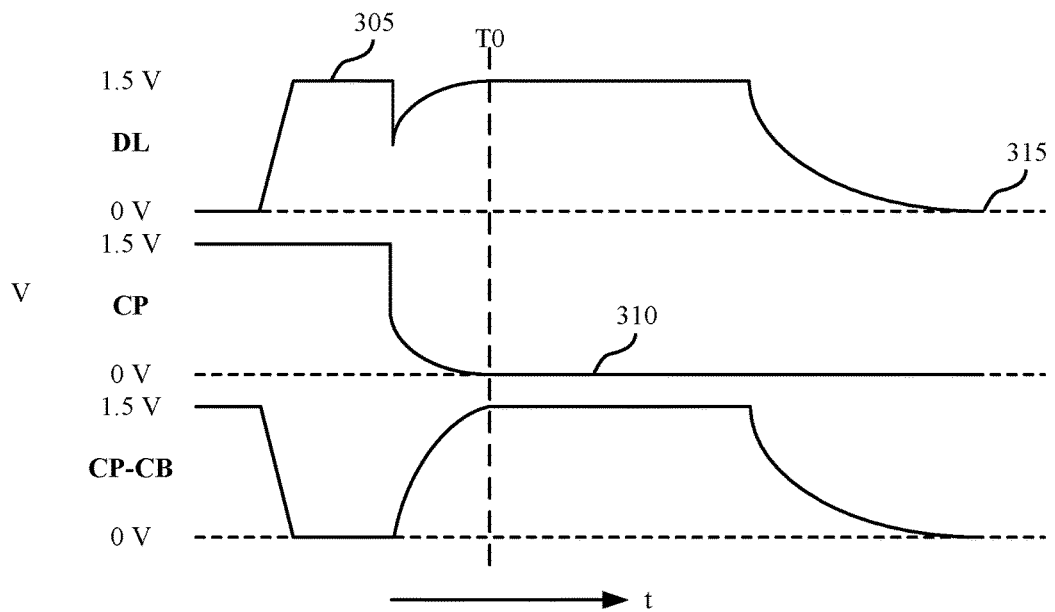
FIG. 3A illustrates a timing diagram of a first set of voltages that may be applied to the digit line and cell plate of a ferroelectric memory cell when writing a logic value to the ferroelectric memory cell, in accordance with various embodiments of the present disclosure.

FIG. 3A illustrates a timing diagram of a first set of voltages 300-a that may be applied to the digit line and cell plate of a ferroelectric memory cell when writing a logic value to the ferroelectric memory cell, in accordance with various embodiments of the present disclosure. FIG. 3A also illustrates a timing diagram of a voltage across the capacitor of the ferroelectric memory cell as the first set of voltages 300-a is applied. In FIG. 3A, voltage is represented on the vertical axis and time is represented on the horizontal axis. In some examples, the voltages in FIG. 3A may be applied to the digit line 115-a and cell plate 210 of the ferroelectric memory cell 105-a described with reference to FIG. 2, and the voltage across the capacitor may be the voltage CP-CB across the capacitor 205 described with reference to FIG. 2. FIG. 3A assumes that a voltage applied to the word line 110-a has already transitioned high, thereby activating the selection component 220 of the ferroelectric memory cell 105-a and enabling a voltage applied to the digit line 115-a to influence the voltage across the capacitor 205.

As shown in FIG. 3A, the voltage applied to the digit line 115-a may be transitioned to a high voltage 305, thereby biasing the digit line 115-a to the high voltage 305. Thereafter, a low voltage 310 may be applied to the cell plate 210, thereby biasing the cell plate 210 to the low voltage 310. The magnitude of the difference between the high voltage 305 (e.g., 1.5 V) and the low voltage 310 (e.g., 0 V) may be equal to the magnitude of a write voltage (e.g., a logic 0 write voltage) for the ferroelectric memory cell 105-a. In other embodiments, different high, low, and difference voltage magnitudes may be used.

Application of the low voltage 310 to the cell plate 210 may temporarily pull down the voltage on the digit line 115-a. Following the temporary pull-down of the voltage on the digit line 115-a, the voltage on the digit line 115-a may return to the high voltage 305 (e.g., 1.5 V), the voltage on the cell plate 210 may reach the low voltage 310 (e.g., 0 V), and the voltage difference across the capacitor 205 (e.g., CP-CB)

may reach the logic 0 write voltage (e.g., −1.5 V). By way of example, the logic 0 write voltage may be reached at a time T0.

After the voltage across the capacitor 205 reaches the logic 0 write voltage, the digit line 115-*a* may be transitioned to a low voltage 315 (e.g., 0 V), and the word line 110-*a* may be transitioned to a low voltage (e.g., 0 V). Transitioning the word line 110-*a* to the low voltage deactivates the selection component 220 and completes a write of a logic 0 to the ferroelectric memory cell 105-*a*.

Figure 3B:
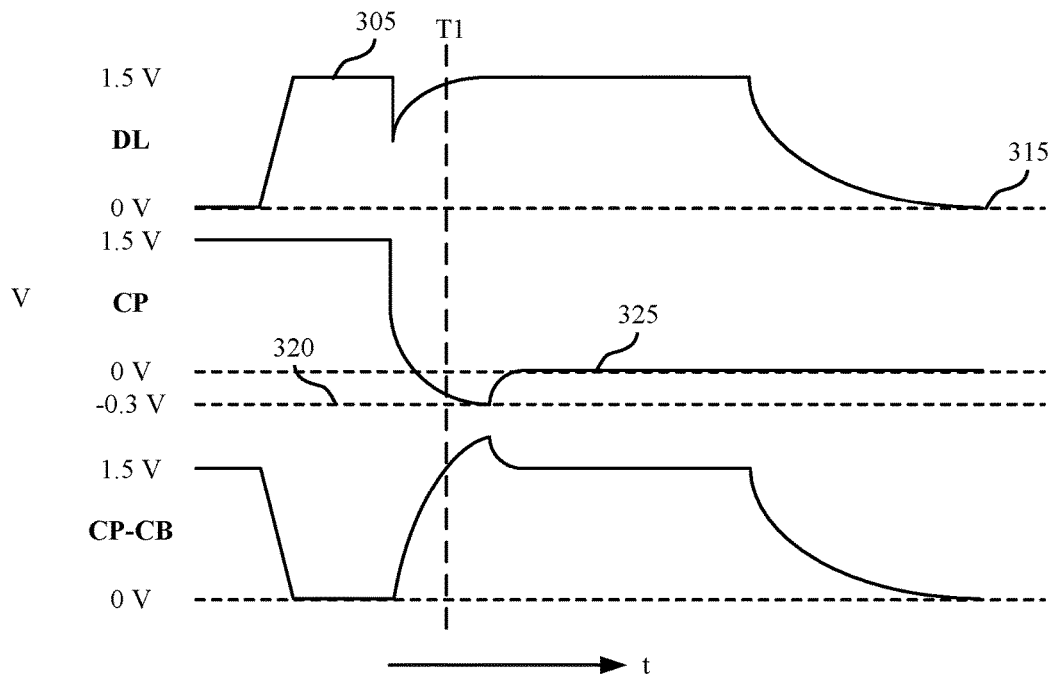
FIG. 3B illustrates a timing diagram of a second set of voltages that may be applied to the digit line and cell plate of a ferroelectric memory cell when writing a logic value to the ferroelectric memory cell, in accordance with various embodiments of the present disclosure.

FIG. 3B illustrates a timing diagram of a second set of voltages 300-*b* that may be applied to the digit line and cell plate of a ferroelectric memory cell when writing a logic value to the ferroelectric memory cell, in accordance with various embodiments of the present disclosure. FIG. 3B also illustrates a timing diagram of a voltage across the capacitor of the ferroelectric memory cell as the second set of voltages 300-*b* is applied. In FIG. 3B, voltage is represented on the vertical axis and time is represented on the horizontal axis. In some examples, the voltages shown in FIG. 3B may be applied to the digit line 115-*a* and cell plate 210 of the ferroelectric memory cell 105-*a* described with reference to FIG. 2, and the voltage across the capacitor may be the voltage CP-CB across the capacitor 205 described with reference to FIG. 2. FIG. 3B assumes that a voltage applied to the word line 110-*a* has already transitioned high, thereby activating the selection component 220 of the ferroelectric memory cell 105-*a* and enabling a voltage applied to the digit line 115-*a* to influence the voltage across the capacitor 205.

As shown in FIG. 3B, the voltage applied to the digit line 115-*a* may be transitioned to a high voltage 305, thereby biasing the digit line 115-*a* to the high voltage 305. Thereafter, a low voltage 320 may be applied to the cell plate 210, thereby biasing the cell plate 210 to the low voltage 320. A magnitude of the difference between the high voltage 305 (e.g., 1.5 V) and the low voltage 320 (e.g., −0.3 V) may be greater than a magnitude of a write voltage (e.g., a logic 0 write voltage) for the ferroelectric memory cell 105-*a*. For example, if the write voltage is 1.5 V, the difference between the high voltage 305 and the low voltage 320 may be 1.7 V to 1.8 V. In other embodiments, different high, low, and difference voltage magnitudes may be used.

Application of the low voltage 320 to the cell plate 210 may temporarily pull down the voltage on the digit line 115-*a*. Following the temporary pull down of the voltage on the digit line 115-*a*, the voltage on the digit line 115-*a* may return to the high voltage 305 (e.g., 1.5 V), the voltage on the cell plate 210 may reach the low voltage 320 (e.g., −0.3 V), and the voltage across the capacitor 205 (e.g., CP-CB) may reach at least the logic 0 write voltage (at least −1.5 V). By way of example, the logic 0 write voltage may be reached at a time T1 which occurs earlier than the time T0 shown in FIG. 3A. In some examples, the voltage on the cell plate 210 may then be allowed to return to (or may be biased to) an intermediate voltage 325 (e.g., 0 V). Returning the cell plate 210 to a zero voltage may reduce stress on the ferroelectric memory cell 105-*a*. After the voltage across the capacitor 205 reaches at least the logic 0 write voltage, the digit line 115-*a* may be transitioned to a low voltage 315 (e.g., 0 V), and the word line 110-*a* may be transitioned to a low voltage (e.g., 0 V). Transitioning the word line 110-*a* to the low voltage deactivates the selection component 220 and completes a write of a logic 0 to the ferroelectric memory cell 105-*a*.

In contrast to the first set of voltages 300-*a* described with reference to FIG. 3A, the second set of voltages 300-*b* described with reference to FIG. 3B can reduce the delay between a time when the cell plate is biased to the low voltage and a time when the logic 0 write voltage is reached.

Figure 4A:
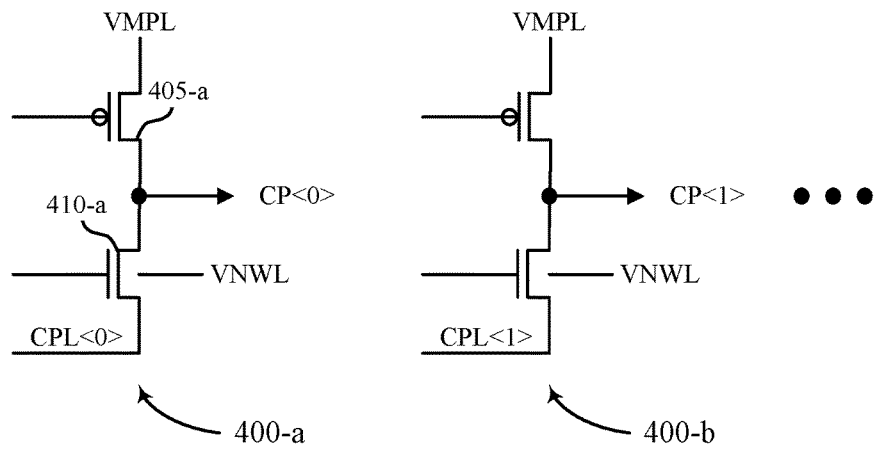
FIGS. 4A, 4B, and 4C illustrate examples of cell plate drivers for providing a faster logic 0 write voltage, in accordance with various embodiments of the present disclosure.

FIG. 4A illustrates a first example of a cell plate driver 400-*a* for providing a faster logic 0 write voltage, in accordance with various embodiments of the present disclosure. The cell plate driver 400-*a* may include a cell plate pull-up mechanism coupled to a cell plate (CP<0>), and a cell plate pull-down mechanism coupled to the cell plate. The cell plate pull-up mechanism may include a p-type metal-oxide semiconductor (PMOS) transistor 405-*a* coupled by its source and drain between a high voltage supply (e.g., a supply of a high voltage (VMPL)) and the cell plate. The cell plate pull-down mechanism may include an n-type metal-oxide semiconductor (NMOS) transistor 410-*a* coupled by its source and drain between a low voltage bias signal (CPL<0>) and the cell plate. The pull-up mechanism and pull-down mechanism may be used to switch the cell plate (i.e., one terminal of ferroelectric capacitor) between a high voltage and a low voltage. In some examples, the cell plate driver 400-*a* may be an example of aspects of the cell plate driver 225 described with reference to FIG. 2, and may be a portion of an electronic memory apparatus, such as a portion of the memory array 100 described with reference to FIGS. 1, 11, and 12.

When not writing a logic 0 to a ferroelectric memory cell associated with the cell plate driver 400-*a*, a gate signal applied to the gate of the PMOS transistor 405-*a* may be switched low to cause the PMOS transistor 405-*a* to conduct and pull (bias) the cell plate to the high voltage, while a gate signal applied to the gate of the NMOS transistor 410-*a* may be switched or held low to cause the NMOS transistor 410-*a* to not conduct. In some examples, the same gate signal may be applied to the gates of the PMOS transistor 405-*a* and the NMOS transistor 410-*a*. Before writing a logic 0 to the ferroelectric memory cell, the gate signal applied to the gate of the PMOS transistor 405-*a* may be switched or held high to cause the PMOS transistor 405-*a* to not conduct, while the gate signal applied to the gate of the NMOS transistor 410-*a* may be switched high to cause the NMOS transistor 410-*a* to conduct and couple the cell plate to the low voltage bias signal. The low voltage bias signal may be switched between an intermediate voltage and a low voltage. In some examples, the intermediate voltage may be 0 V, and the low voltage may be a negative voltage (e.g., −0.2 V or −0.3 V).

In some examples, the low voltage bias signal may be switched to the low voltage (e.g., a negative word line voltage (VNWL)) for a first period of time before writing a logic 0 to the ferroelectric memory (e.g., to bias the cell plate to the low voltage), and then switched to the intermediate voltage for a second period of time before writing the logic 0 to the ferroelectric memory (e.g., to bias the cell plate to the intermediate voltage). Switching to the intermediate voltage after the low voltage can reduce stress on the cell plate driver 400-*a*. In other examples, the low voltage bias signal may be switched to the intermediate voltage for a first period of time before writing a logic 0 to the ferroelectric memory, then switched to the low voltage for a second period of time before writing the logic 0 to the ferroelectric memory (e.g., to bias the cell plate to the low voltage), and then switched to the intermediate voltage for a third period of time before writing the logic 0 to the ferroelectric memory (e.g., to bias the cell plate to the intermediate voltage). Switching to the intermediate voltage before switching to the low voltage can discharge much of the voltage on the cell plate, with little or no power consumption, prior to biasing the cell plate to the low voltage. In other examples, the low voltage bias signal may remain at the low voltage before and during the write of a logic 0 to the ferroelectric memory (though this may increase power consumption).

FIG. 4A shows that other cell plate drivers (e.g., a second cell plate driver 400-*b*) may be configured similarly to the first cell plate driver 400-*a*, but with different cell plate drivers (e.g., the first cell plate driver 400-*a* and the second cell plate driver 400-*b*) being associated with different low voltage bias signals (e.g., the low voltage bias signal CPL<0> may be associated with the first cell plate driver 400-*a*, and the low voltage bias signal CPL<1> may be associated with the second cell plate driver 400-*b*). In this manner, different cell plate drivers may be used to independently bias the cell plates of different ferroelectric memory cells.

Figure 4B:
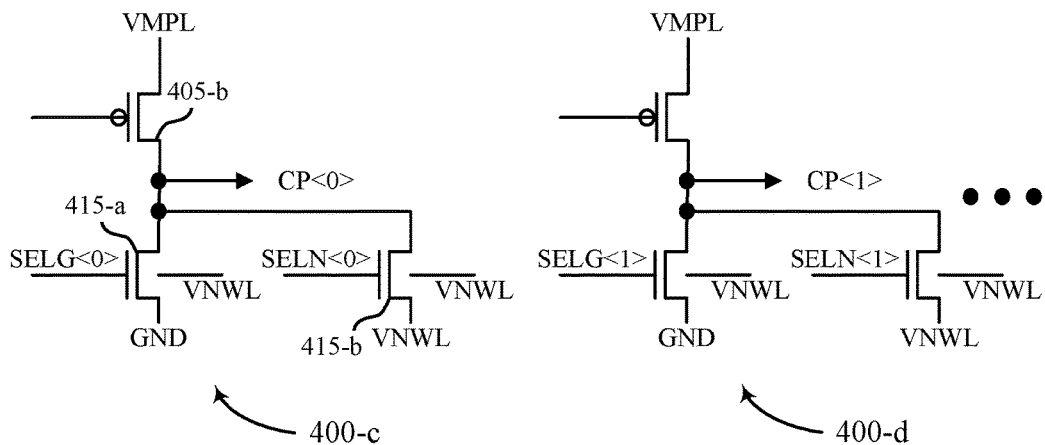

FIG. 4B illustrates a second example of a cell plate driver 400-*c* for providing a faster logic 0 write voltage, in accordance with various embodiments of the present disclosure. The cell plate driver 400-*c* may include a cell plate pull-up mechanism coupled to a cell plate (CP<0>), and a cell plate pull-down mechanism coupled to the cell plate. The cell plate pull-up mechanism may be configured similarly to the cell plate pull-up mechanism described with reference to FIG. 4A and may include a PMOS transistor 405-*b*. The cell plate pull-down mechanism may include a first NMOS transistor 415-*a* and a second NMOS transistor 415-*b*. The first NMOS transistor 415-*a* may be coupled by its source and drain between an intermediate voltage supply (e.g., a supply of an intermediate voltage (GND)) and the cell plate, and the second NMOS transistor 415-*b* may be coupled by its source and drain between a low voltage supply (e.g., a supply of a low voltage (VNWL)) and the cell plate. The pull-up mechanism and pull-down mechanism may be used to switch the cell plate (i.e., one terminal of ferroelectric capacitor) between a high voltage, a low voltage, and an intermediate voltage. In some examples, the cell plate driver 400-*b* may be an example of aspects of the cell plate driver 225 described with reference to FIG. 2, and may be a portion of an electronic memory apparatus, such as a portion of the memory array 100 described with reference to FIGS. 1, 11, and 12.

The pull-down mechanism may be operated by asserting a first selection signal (SELG<0>) to cause the first NMOS transistor 415-*a* to conduct and pull (bias) a voltage of the cell plate to the intermediate voltage, or alternatively asserting a second selection signal (SELN<0>) to cause the second NMOS transistor 415-*b* to conduct and pull (bias) the cell plate to the low voltage. In some examples, the low voltage may be a negative voltage (e.g., −0.2 V or −0.3 V).

In some examples, the cell plate may be biased to the low voltage for a first period of time before writing a logic 0 to the ferroelectric memory, and then biased to the intermediate voltage for a second period of time before writing the logic 0 to the ferroelectric memory. In other examples, the low voltage bias signal may be biased to the intermediate voltage for a first period of time before writing a logic 0 to the ferroelectric memory, then biased to the low voltage for a second period of time before writing the logic 0 to the ferroelectric memory, and then biased to the intermediate voltage for a third period of time before writing the logic 0 to the ferroelectric memory. In other examples, the cell plate may be biased to the low voltage before and during the write of a logic 0 to the ferroelectric memory.

FIG. 4B shows that other cell plate drivers (e.g., a second cell plate driver 400-*d*) may be configured similarly to the first cell plate driver 400-*c*, but with different cell plate drivers (e.g., the first cell plate driver 400-*c* and the second cell plate driver 400-*d*) being associated with different sets of selection signals (e.g., the selection signals SELG<0> and SELN<0> may be associated with the first cell plate driver 400-*c*, and the selection signals SELG<1> and SELN<1> may be associated with the second cell plate driver 400-*d*).

Figure 4C:
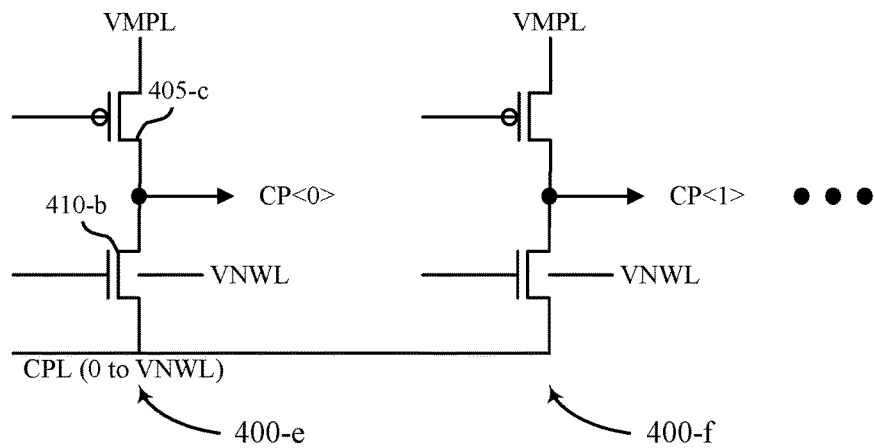

FIG. 4C illustrates a third example of a cell plate driver 400-*e* for providing a faster logic 0 write voltage, in accordance with various embodiments of the present disclosure. The cell plate driver 400-*e* may include a cell plate pull-up mechanism coupled to a cell plate (CP<0>), and a cell plate pull-down mechanism coupled to the cell plate. The cell plate pull-up mechanism may be configured similarly to the cell plate pull-up mechanism described with reference to FIG. 4A and may include a PMOS transistor 405-*c*. The cell plate pull-down mechanism may also be configured similarly to the cell plate pull-down mechanism described with reference to FIG. 4A and may include a NMOS transistor 410-*b* coupled by its source and drain between a low voltage bias signal (CPL) and the cell plate. However, in contrast to the cell plate drivers 400-*a* and 400-*b* described with reference to FIG. 4A, the low voltage bias signal may be provided to each of a plurality of cell plate drivers (e.g., to the cell plate drivers 400-*e* and 400-*f*). The low voltage bias signal may be switched similarly to the low voltage bias signal CPL<0> described with reference to FIG. 4A. The pull-up mechanism and pull-down mechanism may be used to switch the cell plate (i.e., one terminal of ferroelectric capacitor) between a high voltage, a low voltage, and an intermediate voltage. In some examples, the cell plate driver 400-*c* may be an example of aspects of the cell plate driver 225 described with reference to FIG. 2, and may be a portion of an electronic memory apparatus, such as a portion of the memory array 100 described with reference to FIGS. 1, 11, and 12.

The cell plate drivers 400-*e* and 400-*f* may consume more power than the cell plate drivers 400-*a* and 400-*b*, because a need to transition one cell plate low (e.g., a need to transition CP<0> or CP<1> low) requires transitioning all cell plates low. However, the cell plate drivers 400-*e* and 400-*f* may be configured to use fewer metal tracks than the cell plate drivers 400-*a* and 400-*b*.

In some examples, the bodies of the NMOS transistors described with reference to FIGS. 4A, 4B, and 4C may be maintained at VNWL to enable the NMOS transistors to share wells with word line driver NMOS transistors.

Figure 5A:
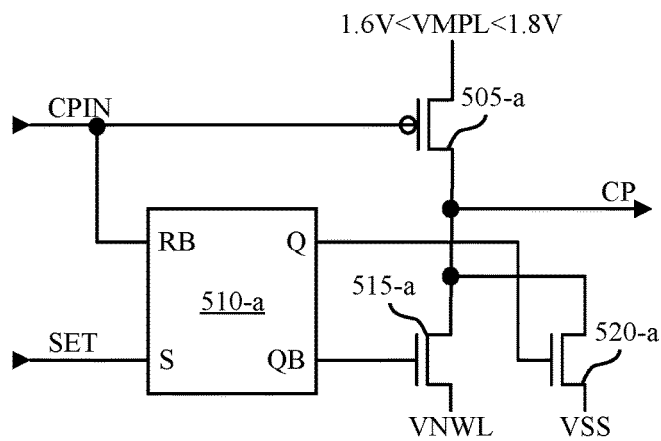
FIGS. 5A, 5B, and 5C illustrate additional examples of cell plate drivers for providing a faster logic 0 write voltage, in accordance with various embodiments of the present disclosure.
Figure 5B:
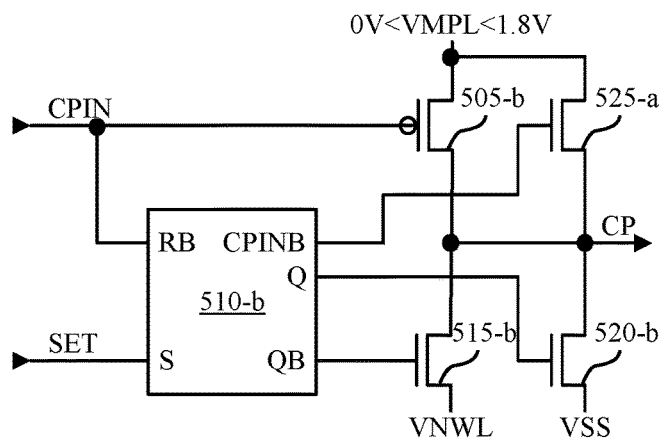
Figure 5C:
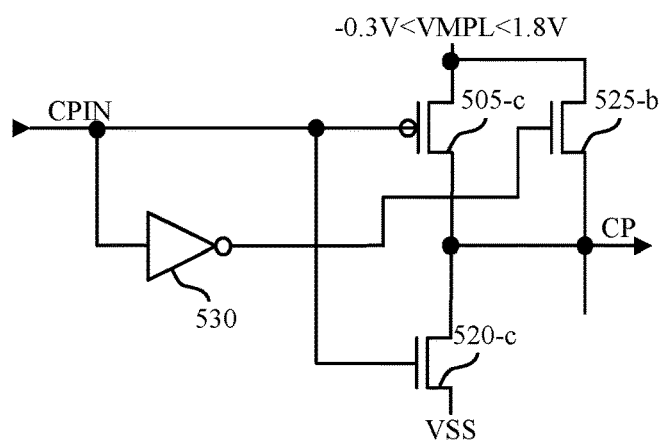

FIGS. 5A, 5B, and 5C illustrate examples of cell plate drivers that use data storage elements, logic elements, and/or voltage switching to reduce the number of metal tracks needed to implement a plurality of cell plate drivers.

FIG. 5A illustrates a fourth example of a cell plate driver 500-*a* for providing a faster logic 0 write voltage, in accordance with various embodiments of the present disclosure. The cell plate driver 500-*a* may include a cell plate pull-up mechanism coupled to a cell plate (CP), and a cell plate pull-down mechanism coupled to the cell plate. The cell plate pull-up mechanism may include a PMOS transistor 505-*a* coupled by its source and drain between a first voltage supply (e.g., a supply of a high voltage (VMPL)) and the cell plate. The cell plate pull-down mechanism may include a data storage element (e.g., a set-reset latch 510-*a*), a first NMOS transistor 515-*a* coupled by its source and drain between a second voltage supply (e.g., a supply of a low voltage (VNWL)) and the cell plate, and a second NMOS transistor 520-*a* coupled by its source and drain between an intermediate voltage supply (a supply of an intermediate voltage (VSS) between the high voltage and the low voltage) and the cell plate. In some examples, the set-reset latch 510-*a* may be configured as a NAND set-reset latch or a NOR set-reset latch. In some examples, the set-reset latch 510-*a* may be configured as a NOR set-reset latch to reduce crowbar current in the set-reset latch 510-*a*. The pull-up mechanism and pull-down mechanism may be used to switch the cell plate (i.e., one terminal of ferroelectric capacitor) between a high voltage and a low voltage. In some examples, the cell plate driver 500-*a* may be an example of aspects of the cell plate driver 225 described with reference to FIG. 2, and may be a portion of an electronic memory apparatus, such as a portion of the memory array 100 described with reference to FIGS. 1, 11, and 12.

In operation, a cell plate input (CPIN) signal may drive both the gate of the PMOS transistor 505-*a* and the reset (RB) input of the set-reset latch 510-*a*. When not writing a logic 0 to a ferroelectric memory cell associated with the cell plate driver 500-*a*, the CPIN signal may be driven low, causing the PMOS transistor 505-*a* to conduct and pull the cell plate to the high voltage. When driving the CPIN signal low, the gates of the first NMOS transistor 515-*a* and the second NMOS transistor 520-*a* may be driven low, so that the high voltage on the cell plate is not discharged.

When writing a logic 0 to the ferroelectric memory cell, the SET signal may be transitioned from high to low (e.g., from a logic 1 to a logic 0), thereby driving the set (S) input of the set-reset latch low and selecting the cell plate driver 500-*a*. The CPIN signal may then be driven high to decouple the cell plate from the high voltage supply (VMPL). Driving the CPIN signal high also applies a logic 1 to the RB input of the set-reset latch 510-*a*, causing the QB output of the set-reset latch 510-*a* to transition high (to a logic 1) while the Q output of the set-reset latch 510-*a* remains low (at a logic 0). When the QB output transitions high, the first NMOS transistor 515-*a* is caused to conduct, pulling (biasing) the cell plate to the low voltage (VNWL). After a period of time following the transition of the SET signal from high to low, the SET signal may be transitioned from low to high (e.g., from a logic 0 to a logic 1), causing the S input to transition high, which in turn causes the QB output to transition low and the Q output to transition high. When the QB output transitions low, the first NMOS transistor 515-*a* ceases to conduct. When the Q output transitions high, the second NMOS transistor 520-*a* conducts, allowing the voltage on the cell plate to assume (or causing the voltage on the cell plate to be biased to) the intermediate voltage. After a period of time following the transition of the SET signal from low to high, the CPIN signal may be transitioned from high to low, thereby driving the RB input low (e.g., to a logic 0) and causing the Q output to transition low while the QB output remains low.

In some examples, the same SET signal may be applied to each of a plurality of cell plate drivers, but different CPIN signals may be applied to each of the plurality of cell plate drivers. This may represent a reduction in the number of wire tracks compared to the cell plate drivers shown in FIGS. 4A, 4B, and 4C. In some examples, the high voltage (VMPL) may be a positive voltage (e.g., 1.6 V to 1.8 V), the intermediate voltage (VSS) may be 0 V, and the low voltage (VNWL) may be a negative voltage (e.g., −0.2 V to −0.3 V).

FIG. 5B illustrates a fifth example of a cell plate driver 500-*b* for providing a faster logic 0 write voltage, in accordance with various embodiments of the present disclosure. The cell plate driver 500-*b* may include a cell plate pull-up mechanism coupled to a cell plate (CP), and a cell plate pull-down mechanism coupled to the cell plate. The cell plate pull-up mechanism may include a PMOS transistor 505-*b* coupled by its source and drain between a variable voltage supply (e.g., a supply of a variable voltage (VMPL)) and the cell plate, and a first NMOS transistor 525-*a* coupled by its source and drain between the variable voltage supply and the cell plate. The cell plate pull-down mechanism may include a data storage element (e.g., a set-reset latch 510-*b*), a second NMOS transistor 515-*b* coupled by its source and drain between a low voltage supply (e.g., a supply of a low voltage (VNWL)) and the cell plate, and a third NMOS transistor 520-*b* coupled by its source and drain between an intermediate voltage supply (a supply of an intermediate voltage (VSS) between the high voltage and the low voltage) and the cell plate. In some examples, the set-reset latch 510-*b* may be configured as a NAND set-reset latch or a NOR set-reset latch. In some examples, the set-reset latch 510-*b* may be configured as a NOR set-reset latch to reduce crowbar current in the set-reset latch 510-*b*. The pull-up mechanism and pull-down mechanism may be used to switch the cell plate (i.e., one terminal of ferroelectric capacitor) between a high voltage, a low voltage, and an intermediate voltage. In some examples, the cell plate driver 500-*b* may be an example of aspects of the cell plate driver 225 described with reference to FIG. 2, and may be a portion of an electronic memory apparatus, such as a portion of the memory array 100 described with reference to FIGS. 1, 11, and 12.

In operation, a cell plate input (CPIN) signal may drive both the gate of the PMOS transistor 505-*b* and the reset (RB) input of the set-reset latch 510-*b*. When not writing a logic 0 to a ferroelectric memory cell associated with the cell plate driver 500-*b*, the variable voltage supply may be driven to a high voltage (e.g., 1.6 V or 1.8 V), and the CPIN signal may be driven low, causing the PMOS transistor 505-*b* to conduct and pull the cell plate to the high voltage. Also when not writing the logic 0 to the ferroelectric memory cell, an inverse of the CPIN signal (provided by the CPINB output of the data storage element) may cause the first NMOS transistor 525-*a* to conduct, which may also pull the cell plate to the high voltage. When driving the CPIN signal low, the gates of the first and second NMOS transistors 515-*b*, 520-*b* may be driven low, so that the high voltage on the cell plate is not discharged.

When writing a logic 0 to the ferroelectric memory cell, the SET signal may be transitioned from high to low (e.g., from a logic 1 to a logic 0), thereby driving the set (S) input of the set-reset latch low and selecting the cell plate driver 500-*a*. Also, the variable voltage supply may be switched from the high voltage to an intermediate voltage (e.g., 0 V). Switching the variable voltage supply to 0 V may discharge much of the voltage on the cell plate (e.g., bias the cell plate to 0 V) with little power consumption. After a period of time following the switch of the variable voltage to the intermediate voltage, the CPIN signal may be driven high to decouple the cell plate from the variable voltage supply. Driving the CPIN signal high also applies a logic 1 to the RB input of the set-reset latch 510-*b*, causing the QB output of the set-reset latch 510-*b* to transition high (to a logic 1) while the Q output of the set-reset latch 510-*a* remains low (at a logic 0). When the QB output transitions high, the second NMOS transistor 515-*b* is caused to conduct, pulling (biasing) the cell plate to the low voltage (VNWL). After a period of time following the transition of the SET signal from high to low, the SET signal may be transitioned from low to high (e.g., from a logic 0 to a logic 1), causing the S input to transition high, which in turn causes the QB output to transition low and the Q output to transition high. When the QB output transitions low, the second NMOS transistor 515-*b* ceases to conduct. When the Q output transitions high, the third NMOS transistor 520-*b* conducts, allowing the voltage on the cell plate to assume (or causing the voltage on the cell plate to be biased to) the intermediate voltage. After a period of time following the transition of the SET signal from low to high, the CPIN signal may be transitioned from high to low, thereby driving the RB input low (e.g., to a logic 0) and causing the Q output to transition low while the QB output remains low.

In some examples, the same SET signal may be applied to each of a plurality of cell plate drivers, but different CPIN signals may be applied to each of the plurality of cell plate drivers. This may represent a reduction in the number of wire tracks compared to the cell plate drivers shown in FIGS. 4A, 4B, and 4C. In some examples, the high voltage may be a positive voltage (e.g., 1.6 V to 1.8 V), the intermediate voltage may be 0 V, and the low voltage (VNWL) may be a negative voltage (e.g., −0.2 V to −0.3 V).

FIG. 5C illustrates a sixth example of a cell plate driver 500-*c* for providing a faster logic 0 write voltage, in accordance with various embodiments of the present disclosure. The cell plate driver 500-*c* may include a cell plate pull-up mechanism coupled to a cell plate (CP), and a cell plate pull-down mechanism coupled to the cell plate. The cell plate pull-up mechanism may include a PMOS transistor 505-*c* coupled by its source and drain between a variable voltage supply (e.g., a supply of a variable voltage (VMPL)) and the cell plate, an inverter 530, and a first NMOS transistor 525-*b* coupled by its source and drain between the variable voltage supply and the cell plate. The cell plate pull-down mechanism may include a second NMOS transistor 520-*c* coupled by its source and drain between an intermediate voltage supply (e.g., a supply of an intermediate voltage (VSS)) and the cell plate. The pull-up mechanism and pull-down mechanism may be used to switch the cell plate (i.e., one terminal of ferroelectric capacitor) between a high voltage, a low voltage, and an intermediate voltage. In some examples, the cell plate driver 500-*c* may be an example of aspects of the cell plate driver 225 described with reference to FIG. 2, and may be a portion of an electronic memory apparatus, such as a portion of the memory array 100 described with reference to FIGS. 1, 11, and 12.

In operation, a cell plate input (CPIN) signal may drive the gate of the PMOS transistor 505-*c* and be received by the inverter 530. When not writing a logic 0 to a ferroelectric memory cell associated with the cell plate driver 500-*c*, the variable voltage supply may be driven to a high voltage (e.g., 1.6 V or 1.8 V), and the CPIN signal may be driven low, causing the PMOS transistor 505-*c* to conduct and pull the cell plate to the high voltage. Also when not writing the logic 0 to the ferroelectric memory cell, an inverse of the CPIN signal (provided at the output of the inverter 530) may cause the first NMOS transistor 525-*b* to conduct, which may also pull the cell plate to the high voltage. When driving the CPIN signal low, the gate of the second NMOS transistor 520-*c* may be driven low, so that the high voltage on the cell plate is not discharged.

When writing a logic 0 to the ferroelectric memory cell, the variable voltage supply may be switched from the high voltage to a low voltage (e.g., −0.2 V or −0.3 V). Switching the variable voltage supply to the low voltage may pull (bias) the cell plate to the low voltage. After a period of time following the switch of the variable voltage to the low voltage, the CPIN signal may be driven high to decouple the cell plate from the variable voltage supply. Driving the CPIN signal high also causes the second NMOS transistor 520-*c* to conduct, allowing the voltage on the cell plate to assume (or causing the voltage on the cell plate to be biased to) the intermediate voltage. After a period of time following the transition of the CPIN signal from low to high, the CPIN signal may be transitioned from high to low, thereby causing the second NMOS transistor 520-*c* to cease conducting and causing the PMOS transistor 505-*c* and the first NMOS transistor 525-*b* to conduct.

In some examples, different CPIN signals may be applied to each of a plurality of cell plate drivers. This may represent a further reduction in the number of wire tracks compared to the cell plate drivers shown in FIGS. 4A, 4B, 4C, 5A, and 5B. In some examples, the high voltage may be a positive voltage (e.g., 1.6 V to 1.8 V), the intermediate voltage may be 0 V, and the low voltage (VNWL) may be a negative voltage (e.g., −0.2 V to −0.3 V).

Figure 6:
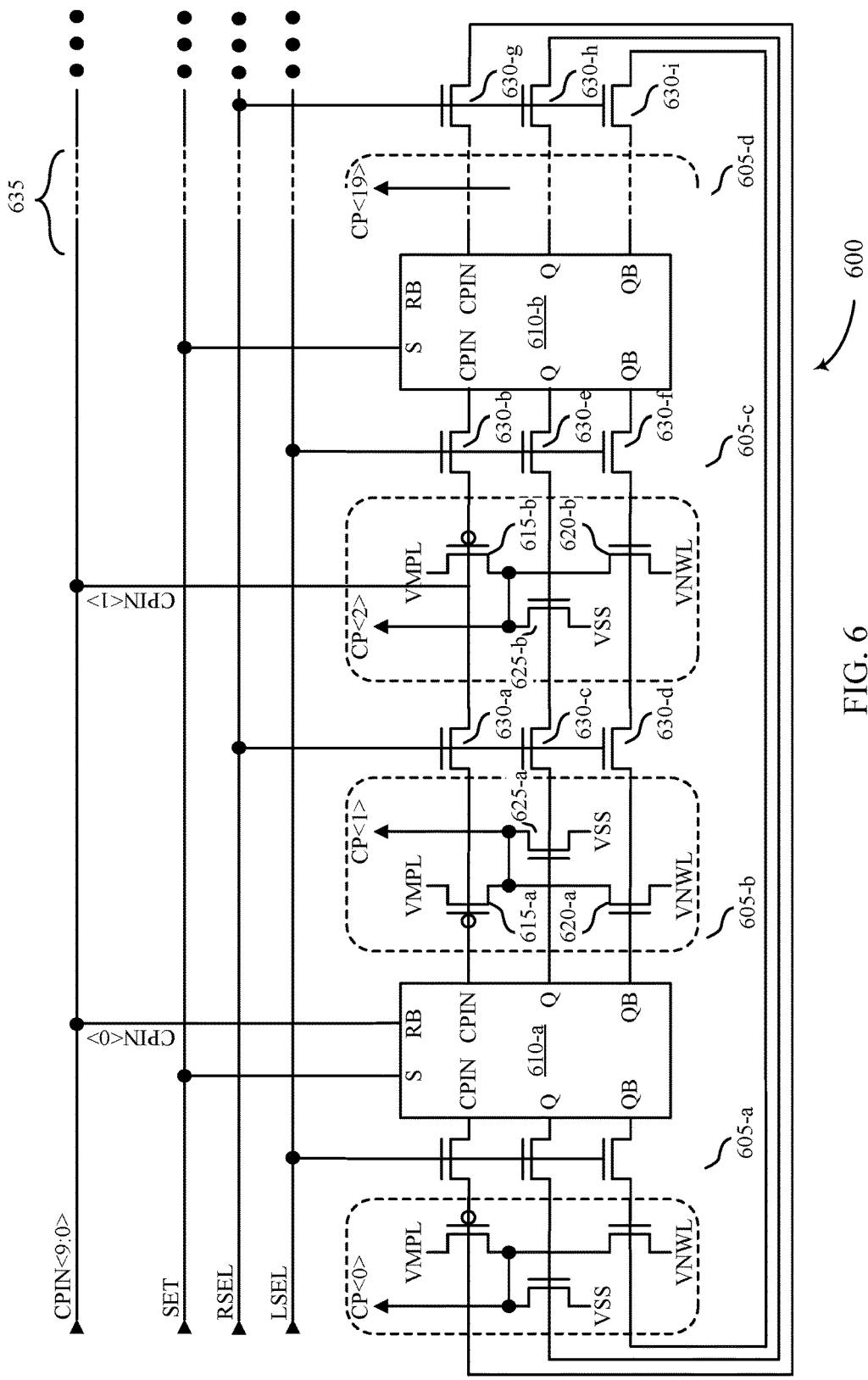
FIG. 6 illustrates a portion of an electronic memory apparatus usable for barrel shifting, in accordance with various embodiments of the present disclosure.

FIG. 6 illustrates a portion of an electronic memory apparatus 600 usable for barrel shifting, in accordance with various embodiments of the present disclosure. The portion of the electronic memory apparatus 600 includes a plurality of cell plate drivers associated with a plurality of ferroelectric memory cells. As shown, the portion of the electronic memory apparatus 600 may include a first cell plate driver 605-*a* (e.g., a CP<0> driver) associated with a first ferroelectric memory cell, a second cell plate driver 605-*b* (e.g., a CP<1> driver) associated with a second ferroelectric memory cell, and a third cell plate driver 605-*c* (e.g., a CP<2> driver) associated with a third ferroelectric memory cell. FIG. 6 also shows a portion of a fourth cell plate driver 605-*d* (e.g., a CP<19> driver), which may be associated with a fourth ferroelectric memory cell. Additional CP drivers (e.g., CP<3>-CP<18> drivers) may be included in a region 635 between the CP<2> and CP<19> drivers. In some examples, the portion of the electronic memory apparatus 600 may be a portion of the memory array 100 described with reference to FIGS. 1, 11, and 12, and the ferroelectric memory cells may be examples of aspects of the ferroelectric memory cells 105 described with reference to FIGS. 1, 2, 11, and 12.

By way of example, each of the second cell plate driver 605-*b* and the fourth cell plate driver 605-*d* may be configured similarly to the cell plate driver 500 described with reference to FIG. 5A (e.g., the second cell plate driver 605-*b* may include a data storage element 610-*a*, a cell plate pull-up mechanism (e.g., a PMOS transistor 615-*a*), and a cell plate pull-down mechanism (e.g., a first NMOS transistor 620-*a* and a second NMOS transistor 625-*a*). The CPIN outputs of a data storage element may be pass-through outputs (i.e., the CPIN outputs of a data storage element may not be associated with the data storage function of the data storage element). For example, the CPIN outputs of the data storage element 610-*a* may pass the signal CPIN<0> through to the CPIN outputs of the data storage element 610-*a*.

By way of further example, each of the first cell plate driver 605-*a* and the third cell plate driver 605-*c* may be configured similarly to the cell plate driver 500 described with reference to FIG. 5A, except that each of the first cell plate driver 605-*a* and the third cell plate driver 605-*c* may include a cell plate pull-up mechanism (e.g., a PMOS transistor) and a cell plate pull-down mechanism (e.g., a first NMOS transistor and a second NMOS transistor) that may be selectively coupled to a set of outputs of a data storage element associated with another cell plate driver. For example, the cell plate pull-up mechanism of the third cell plate driver 605-*c* may include a PMOS transistor 615-*b*. A RSEL signal (e.g., a right barrel shift signal) may be applied to the gate of a first pass gate 630-a to selectively couple the gate of the PMOS transistor 615-b to the CPIN output of the data storage element 610-a associated with the second cell plate driver 605-b (e.g., via a source-to-drain connection through the first pass gate 630-a). A LSEL signal (e.g., a left barrel shift signal) may be applied to the gate of a second pass gate 630-b to selectively couple the gate of the PMOS transistor 615-b to the CPIN output of the data storage element 610-b associated with the fourth cell plate driver 605-d (e.g., via a source-to-drain connection through the second pass gate 630-b). The cell plate pull-down mechanism of the third cell plate driver 605-c may include a first NMOS transistor 620-b and a second NMOS transistor 625-b. The RSEL signal may be applied to the gates of a third pass gate 630-c and a fourth pass gate 630-d to selectively couple the gates of the first NMOS transistor 620-b and the second NMOS transistor 625-b to respective ones of the Q and QB outputs of the data storage element 610-a associated with the second cell plate driver 605-b (e.g., via source-to-drain connections through the third pass gate 630-c and fourth pass gate 630-d). Similarly, the LSEL signal may be applied to the gates of a fifth pass gate 630-e and a sixth pass gate 630-f to selectively couple the gates of the first NMOS transistor 620-b and the second NMOS transistor 625-b to respective ones of the Q and QB outputs of the data storage element 610-b associated with the fourth cell plate driver 605-d (e.g., via source-to-drain connections through the fifth pass gate 630-e and sixth pass gate 630-f).

In operation, a controller (e.g., a memory controller) may facilitate a right barrel shift of data stored in ferroelectric memory cells by asserting the RSEL signal to activate a set of pass gates including the first pass gate 630-a, the third pass gate 630-c, and the fourth pass gate 630-d, which pass gate activations may couple the pull-up and pull-down mechanisms of the third cell plate driver 605-c to a set of outputs of the data storage element 610-a associated with the second cell plate driver 605-b. The controller may then temporarily bias the second cell plate (CP<1>) and the third cell plate (CP<2>) to a low voltage (e.g., VNWL). The second and third cell plates may be biased to the low voltage at the same time and in a same operation or set of operations (e.g., by selecting and operating the data storage element 610-a as described with reference to FIG. 5A). Alternatively, the controller may facilitate a left barrel shift of data stored in ferroelectric memory cells by asserting the LSEL signal to activate a set of pass gates including the second pass gate 630-b, the fifth pass gate 630-e, and the sixth pass gate 630-f, which pass gate activations may couple the pull-up and pull-down mechanisms of the third cell plate driver 605-c to a set of outputs of the data storage element 610-b associated with the fourth cell plate driver 605-d. The controller may then temporarily bias the third cell plate (CP<2>) and a fourth cell plate to the low voltage. The third and fourth cell plates may be biased to the low voltage at the same time and in a same operation or set of operations (e.g., by selecting and operating the data storage element 610-b as described with reference to FIG. 5A).

Similarly to how the second and third cell plates may be biased to the low voltage at the same time and in a same operation or set of operations during a right barrel shift of data, the first cell plate (CP<0>) and the fourth cell plate (CP<19>) may be biased to the low voltage at the same time and in a same operation or set of operations during the right barrel shift of data (e.g., because of a seventh pass gate 630-g, an eighth pass gate 630-h, and a ninth pass gate 630-i that couple transistors of the fourth cell plate driver 605-d (the CP<19> driver) to corresponding transistors of the first cell plate driver 605-a (the CP<0> driver)).

In alternative embodiments of the portion of the electronic memory apparatus 600, the data storage element 610-a and data storage element 610-b may include types of data storage elements other than set-reset latches. In some embodiments, the pass gates used to selectively couple the pull-up and pull-down mechanisms of one cell plate driver to another cell plate driver may be separately operated.

Figure 7:
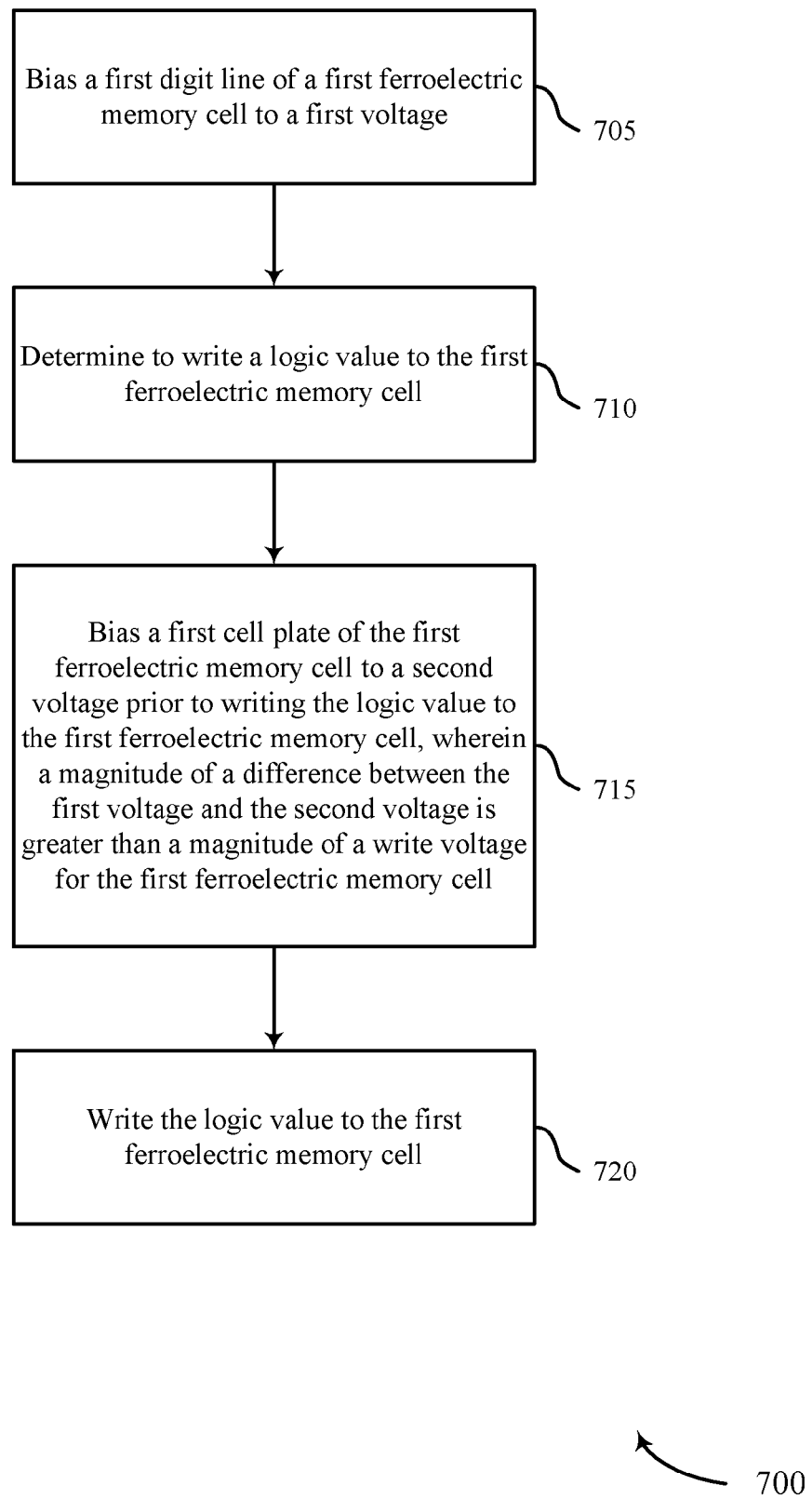
FIG. 7 shows a flowchart illustrating a method of operating at least one ferroelectric memory cell, in accordance with various embodiments of the present disclosure.

FIG. 7 shows a flowchart illustrating a method 700 of operating at least one ferroelectric memory cell, in accordance with various embodiments of the present disclosure. The operations of the method 700 may be performed on or within a memory array, such as the memory array 100 described with reference to FIGS. 1, 11, and 12. In some examples, the operations of the method 700 may be performed by or under the control of a memory controller, such as the memory controller 140 described with reference to FIGS. 1, 11, and 12. In some examples, a memory controller may execute a set of codes to control the functional elements of a memory array to perform the functions described below. Additionally or alternatively, the memory controller may perform aspects of the functions described below using special-purpose hardware.

At block 705, the method may include biasing a first digit line of a first ferroelectric memory cell to a first voltage (e.g., a high voltage), as described with reference to FIGS. 2-6. In some examples, the operation(s) at block 705 may be performed using the memory array 100 described with reference to FIGS. 1, 11, and 12.

At block 710, the method may include determining to write a logic value to the first ferroelectric memory cell, as described with reference to FIGS. 2-6. In some examples, the operation(s) at block 710 may be performed using the memory array 100 described with reference to FIGS. 1, 11, and 12.

At block 715, the method may include biasing a first cell plate of the first ferroelectric memory cell to a second voltage (e.g., a low voltage, lower than the high voltage) prior to writing the logic value to the first ferroelectric memory cell. The first voltage (to which the first digit line is biased) and the second voltage (to which the first cell plate is biased) may be configured to provide a difference between the first and second voltages having a magnitude greater than a magnitude of a write voltage for the first ferroelectric memory cell, as described with reference to FIGS. 2-6. In some examples, biasing the first cell plate to the second voltage may include biasing the first cell plate to a third voltage between the first voltage and the second voltage, and then biasing the first cell plate to the second voltage after biasing the first cell plate to the third voltage. In some examples, the second voltage may be a negative voltage. In some examples, the negative voltage may be obtained from a voltage source such as a negative word line voltage source (e.g., a voltage source used to apply a negative voltage to a word line when erasing the first ferroelectric memory cell) or a bulk bias voltage source. In some examples, the operation(s) at block 715 may be performed using the memory array 100 described with reference to FIGS. 1, 11, and 12, or the cell plate driver 225, 400, 500, or 605 described with reference to FIGS. 2, 4, 5, and 6.

At block 720, the method may include writing the logic value to the first ferroelectric memory cell, as described with reference to FIGS. 2-6. In some examples, the operation(s) at block 720 may be performed using the memory array 100 described with reference to FIGS. 1, 11, and 12.

In some examples, the method 700 may be performed for each ferroelectric memory cell in a plurality of ferroelectric memory cells, to serially or in parallel write a logic value to each ferroelectric memory cell in the plurality of ferroelectric memory cells. When the method is performed to write a logic value to the first ferroelectric memory cell and at least one additional ferroelectric memory cell (e.g., at least a second ferroelectric memory cell) in parallel, the method may include biasing a second cell plate of the second ferroelectric memory cell to the second voltage. In some examples, the first cell plate and the second cell plate may be biased to the second voltage in a same operation (e.g., by operating a single cell plate bias driver for the first cell plate and the second cell plate), as described with reference to FIG. 4C. In other examples, the first cell plate and the second cell plate may be biased to the second voltage separately and at a same time (e.g., by operating a first cell plate bias driver to bias the first cell plate to the second voltage, and by operating a second cell plate bias driver to bias the second cell plate to the second voltage), as described with reference to FIG. 4A.

Figure 8:
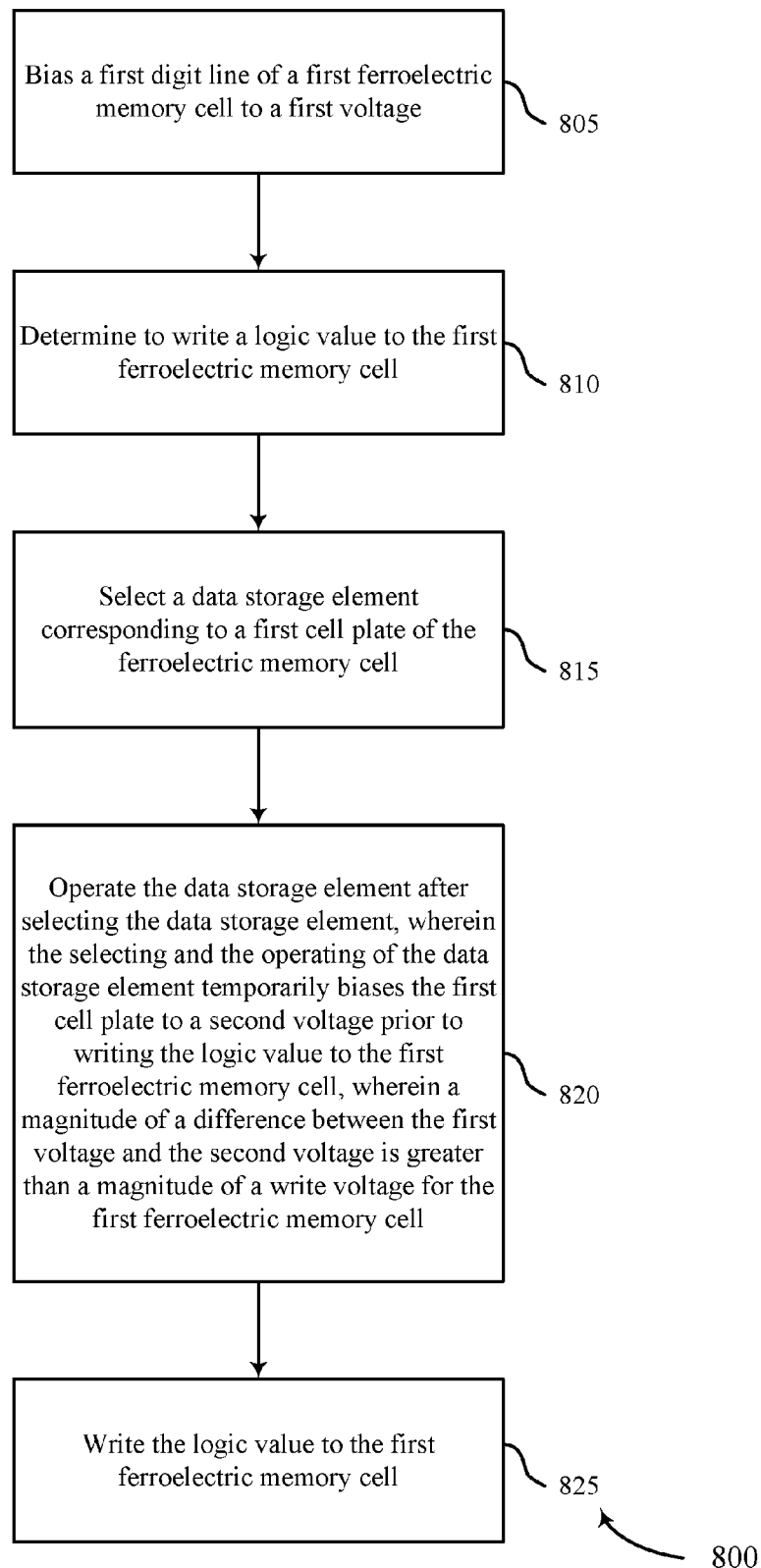
FIG. 8 shows a flowchart illustrating a method of operating at least one ferroelectric memory cell, in accordance with various embodiments of the present disclosure.

FIG. 8 shows a flowchart illustrating a method 800 of operating at least one ferroelectric memory cell, in accordance with various embodiments of the present disclosure. The operations of the method 800 may be performed on or within a memory array, such as the memory array 100 described with reference to FIGS. 1, 11, and 12. In some examples, the operations of the method 800 may be performed by or under the control of a memory controller, such as the memory controller 140 described with reference to FIGS. 1, 11, and 12. In some examples, a memory controller may execute a set of codes to control the functional elements of a memory array to perform the functions described below. Additionally or alternatively, the memory controller may perform aspects of the functions described below using special-purpose hardware.

At block 805, the method may include biasing a first digit line of a first ferroelectric memory cell to a first voltage (e.g., a high voltage), as described with reference to FIGS. 2-6. In some examples, biasing the first cell plate to the second voltage may include biasing the first cell plate to a third voltage between the first voltage and the second voltage, and then biasing the first cell plate to the second voltage after biasing the first cell plate to the third voltage. In some examples, the second voltage may be a negative voltage. In some examples, the negative voltage may be obtained from a voltage source such as a negative word line voltage source (e.g., a voltage source used to apply a negative voltage to a word line when erasing the first ferroelectric memory cell) or a bulk bias voltage source. In some examples, the operation(s) at block 805 may be performed using the memory array 100 described with reference to FIGS. 1, 11, and 12.

At block 810, the method may include determining to write a logic value to the first ferroelectric memory cell, as described with reference to FIGS. 2-6. In some examples, the operation(s) at block 810 may be performed using the memory array 100 described with reference to FIGS. 1, 11, and 12.

At blocks 815 and 820, the method may include biasing a first cell plate of the first ferroelectric memory cell to a second voltage (e.g., a low voltage, lower than the high voltage) prior to writing the logic value to the first ferroelectric memory cell. The first voltage (to which the first digit line is biased) and the second voltage (to which the first cell plate is biased) may be configured to provide a difference between the first and second voltages having a magnitude greater than a magnitude of a write voltage for the first ferroelectric memory cell, as described with reference to FIGS. 2-6. At block 815, the method may include selecting a data storage element corresponding to the first cell plate. In some examples, the data storage element may include at least one latch selected from the group consisting of: a NAND set-reset latch, a NOR set-reset latch, a JK latch, a D flip-flop, and a T flip-flop. At block 820, the method may include operating the data storage element. The selecting and operating of the data storage element may temporarily bias the first cell plate to the second voltage. In some examples, the data storage element may be operated to bias the first cell plate to the second voltage in multiple steps (e.g., to one or more intermediate voltages between the first voltage and the second voltage, and then to the second voltage). In some examples, the operation(s) at block 815 or 820 may be performed using the memory array 100 described with reference to FIGS. 1, 11, and 12, or the cell plate driver 225, 400, 500, or 605 described with reference to FIGS. 2, 4, 5, and 6.

At block 825, the method may include writing the logic value to the first ferroelectric memory cell, as described with reference to FIGS. 2-6. In some examples, the operation(s) at block 825 may be performed using the memory array 100 described with reference to FIGS. 1, 11, and 12.

In some examples, the method 800 may be performed for each ferroelectric memory cell in a plurality of ferroelectric memory cells. For example, in parallel with the operation(s) at blocks 805, 810, 815, 820, and 825, the method may include biasing a second digit line of a second ferroelectric memory cell may be biased to the first voltage, determining to write a logic value to the second ferroelectric memory cell, biasing a second cell plate of the second ferroelectric memory cell to the second voltage prior to writing the logic value to the second ferroelectric memory cell, and writing the logic value to the second ferroelectric memory cell. In these examples, the second cell plate of the second ferroelectric memory cell may be biased to the second voltage by activating a set of one or more pass gates coupled to a set of outputs of the data storage element. Activating the set of one or more pass gates may enable the operations of selecting and operating the data storage element, at blocks 815 and 820, to temporarily bias the second cell plate to the second voltage (e.g., in parallel with biasing the first cell plate to the second voltage), as described with reference to FIG. 6.

The methods 700 and 800 may decrease the time to reach a logic 0 write voltage for a ferroelectric memory cell. It should be noted that methods 700 and 800 describes possible implementations, and the operations and steps of the methods 700 and 800 may be rearranged or otherwise modified such that other implementations are possible. In some examples, aspects of the methods 700 and 800 may be combined.

Figure 9:
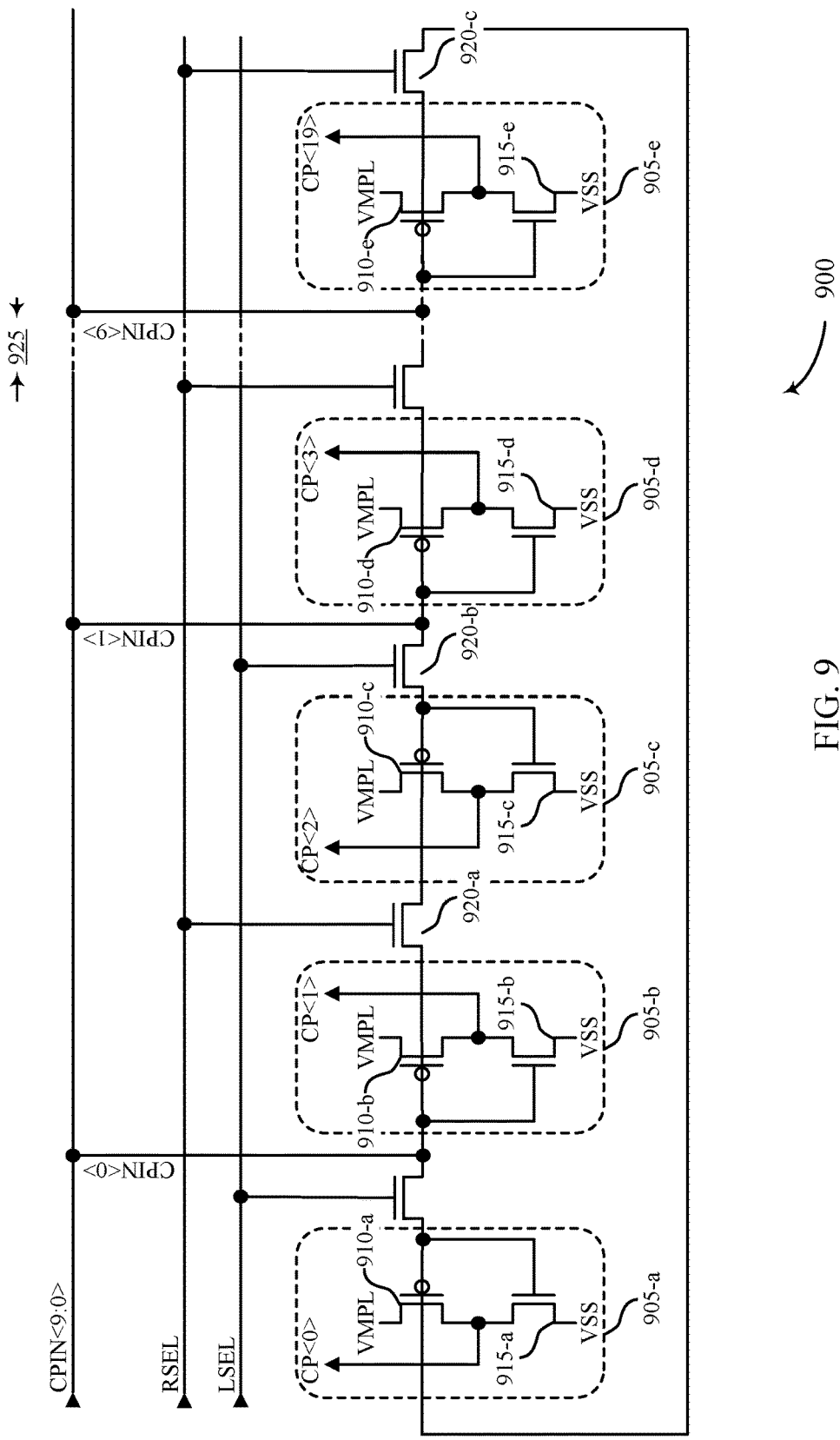
FIG. 9 illustrates a portion of an electronic memory apparatus usable for barrel shifting, in accordance with various embodiments of the present disclosure.

FIG. 9 illustrates a portion of an electronic memory apparatus 900 usable for barrel shifting, in accordance with various embodiments of the present disclosure. The portion of the electronic memory apparatus 900 includes a plurality of cell plate drivers associated with a plurality of ferroelectric memory cells. As shown, the portion of the electronic memory apparatus 900 may include a first cell plate driver 905-*a* (e.g., a CP<0> driver) associated with a first ferroelectric memory cell, a second cell plate driver 905-*b* (e.g., a CP<1> driver) associated with a second ferroelectric memory cell, a third cell plate driver 905-*c* (e.g., a CP<2> driver) associated with a third ferroelectric memory cell, a fourth cell plate driver 905-*d* (e.g., a CP<3> driver), associated with a fourth ferroelectric memory cell, and a fifth cell plate driver 905-*e* (e.g., a CP<19> driver) associated with a fifth ferroelectric memory cell. Additional CP drivers (e.g., CP<4>-CP<18> drivers) may be included in a region 925 between the CP<3> and CP<19> drivers. In some examples, the portion of the electronic memory apparatus 900 may be a portion of the memory array 100 described with reference to FIGS. 1, 11, and 12, and the ferroelectric memory cells may be examples of aspects of the ferroelectric memory cells 105 described with reference to FIGS. 1, 2, 11, and 12.

Each of the cell plate drivers may be configured in a similar manner and may include a cell plate pull-up mechanism (e.g., a PMOS transistor 910-*a*, 910-*b*, 910-*c*, 910-*d*, or 910-*e*) and a cell plate pull-down mechanism (e.g., a NMOS transistor 915-*a*, 915-*b*, 915-*c*, 915-*d*, or 915-*e*). In some examples, as shown, the pull-up and pull-down mechanisms of a cell plate driver may be driven by the same CPIN signal. For example, the gates of the PMOS transistor 910-*b* and NMOS transistor 915-*b* of the second cell plate driver 905-*b* may be driven by the CPIN<0> signal.

For some cell plate drivers (e.g., the second cell plate driver 905-*b*, the fourth cell plate driver 905-*d*, and the fifth cell plate driver 905-*e*), a drive signal (e.g., CPIN<0>, CPIN<1>, or CP<9>) may be supplied directly to the cell plate driver. For other cell plate drivers (e.g., the first cell plate driver 905-*a* and the third cell plate driver 905-*c*) a drive signal (e.g., CPIN<0> or CPIN<1>) may be supplied to the cell plate driver through a pass gate. For example, the third cell plate driver 905-*c* may receive a drive signal (e.g., CPIN<0>) through a first pass gate 920-*a*. Alternatively, the third cell plate driver 905-*c* may receive a drive signal (e.g., CPIN<1>) through a second pass gate 920-*b*.

In operation, a controller (e.g., a memory controller) may facilitate a right barrel shift of data stored in ferroelectric memory cells by asserting the RSEL signal to activate at least the first pass gate 920-*a*, which pass gate activation may supply the CPIN<0> signal to the pull-up and pull-down mechanisms of the third cell plate driver 905-*c*. The controller may then temporarily bias the second cell plate (CP<1>) and the third cell plate (CP<2>) to a low voltage (e.g., VSS) or a high voltage (e.g., VMPL). The second and third cell plates may be biased to the low voltage at the same time and in a same operation or set of operations (e.g., by driving CPIN<0> high). The second and third cell plates may alternatively be biased to the high voltage at the same time and in a same operation or set of operations (e.g., by driving CPIN<0> low). Alternatively, the controller may facilitate a left barrel shift of data stored in ferroelectric memory cells by asserting the LSEL signal to activate at least the second pass gate 920-*b*, which pass gate activations may supply the CPIN<1> signal to the pull-up and pull-down mechanisms of the third cell plate driver 905-*c*. The controller may then temporarily bias the third cell plate (CP<2>) and the fourth cell plate (CP<3>) to the low voltage or the high voltage. The third and fourth cell plates may be biased to the low voltage at the same time and in a same operation or set of operations (e.g., by driving CPIN<1> high). The third and fourth cell plates may alternatively be biased to the high voltage at the same time and in a same operation or set of operations (e.g., by driving CPIN<1> low).

Similarly to how the second and third cell plates may be biased to the low voltage (or alternatively to the high voltage) at the same time and in a same operation or set of operations during a right barrel shift of data, the first cell plate (CP<0>) and the fifth cell plate (CP<19>) may be biased to the low voltage (or alternatively to the high voltage) at the same time and in a same operation or set of operations during the right barrel shift of data (e.g., because of a third pass gate 920-*c* that couples the fifth cell plate driver 905-*e* (the CP<19> driver) to the first cell plate driver 905-*a* (the CP<0> driver)).

Figure 10:
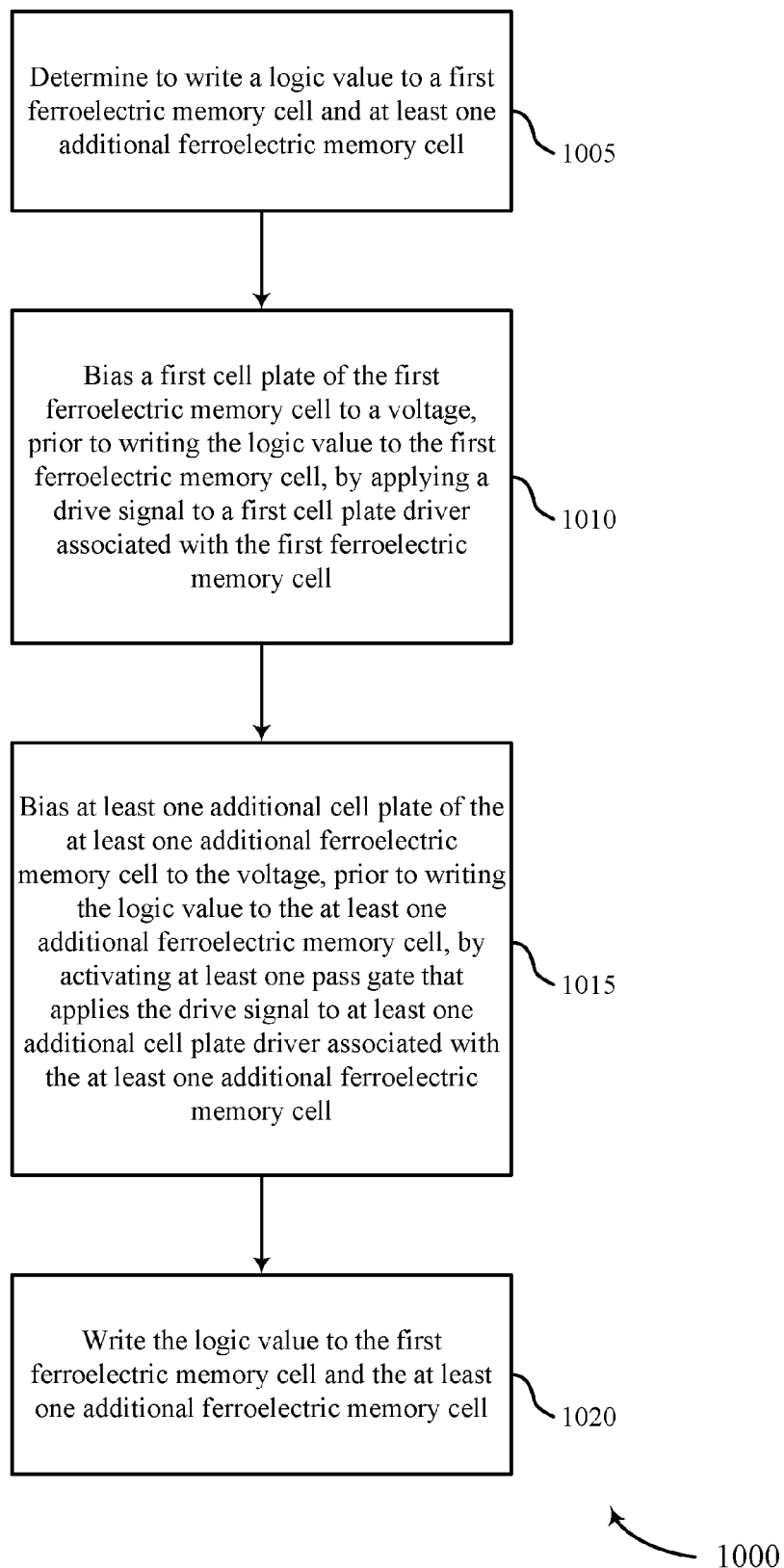
FIG. 10 shows a flowchart illustrating a method of operating at least one ferroelectric memory cell, in accordance with various embodiments of the present disclosure.

FIG. 10 shows a flowchart illustrating a method 1000 of operating at least one ferroelectric memory cell, in accordance with various embodiments of the present disclosure. The operations of the method 1000 may be performed on or within a memory array, such as the memory array 100 described with reference to FIGS. 1, 11, and 12. In some examples, the operations of the method 1000 may be performed by or under the control of a memory controller, such as the memory controller 140 described with reference to FIGS. 1, 11, and 12. In some examples, a memory controller may execute a set of codes to control the functional elements of a memory array to perform the functions described below. Additionally or alternatively, the memory controller may perform aspects of the functions described below using special-purpose hardware.

At block 1005, the method may include determining to write a logic value to a first ferroelectric memory cell and at least one additional ferroelectric memory cell, as described with reference to FIGS. 2, 3, and 9. In some examples, the operation(s) at block 1005 may be performed using the memory array 100 described with reference to FIGS. 1, 11, and 12.

At block 1010, the method may include biasing a first cell plate of the first ferroelectric memory cell to a voltage (e.g., a low voltage, lower than the high voltage), prior to writing the logic value to the first ferroelectric memory cell, by applying a drive signal to a first cell plate driver associated with the first ferroelectric memory cell, as described with reference to FIGS. 2, 3, and 9. In some examples, the operation(s) at block 1010 may be performed using the memory array 100 described with reference to FIGS. 1, 11, and 12, or the cell plate drivers 225 or 905 described with reference to FIGS. 2 and 9.

At block 1015, the method may include biasing at least one additional cell plate of the at least one additional ferroelectric memory cell to the voltage, prior to writing the logic value to the at least one additional ferroelectric memory cell. In some examples, the at least one additional cell plate may be biased to the voltage by activating at least one pass gate that applies the drive signal to at least one additional cell plate driver associated with the at least one additional ferroelectric memory cell, as described with reference to FIGS. 2, 3, and 9. In some examples, the operation(s) at block 1015 may be performed using the memory array 100 described with reference to FIGS. 1, 11, and 12, or the cell plate driver 225 or 905 described with reference to FIGS. 2 and 9.

In some examples of the method 1000, activating the at least one pass gate may include activating a first pass gate when the at least one additional ferroelectric memory cell includes a second ferroelectric memory cell, and activating a second pass gate when the at least one additional ferroelectric memory cell includes a third ferroelectric memory cell. When the first ferroelectric memory cell is logically positioned between the second ferroelectric memory cell and the third ferroelectric memory cell, activating the first pass gate may enable a data shift in a first direction, and activating the second pass gate may enable a data shift in a second direction. In some examples, the first direction and the second direction may be opposite directions (e.g., left and right data shifts, respectively).

At block 1020, the method may include writing the logic value to the first ferroelectric memory cell and the at least one additional ferroelectric memory cell, as described with reference to FIGS. 1, 2, 3, and 9. In some examples, the operation(s) at block 1020 may be performed using the memory array 100 described with reference to FIGS. 1, 11, and 12.

The method 1000 may facilitate barrel shifting of data stored in ferroelectric memory cells. It should be noted that method 1000 describes possible implementations, and the operations and steps of the method 1000 may be rearranged or otherwise modified such that other implementations are possible.

Figure 11:
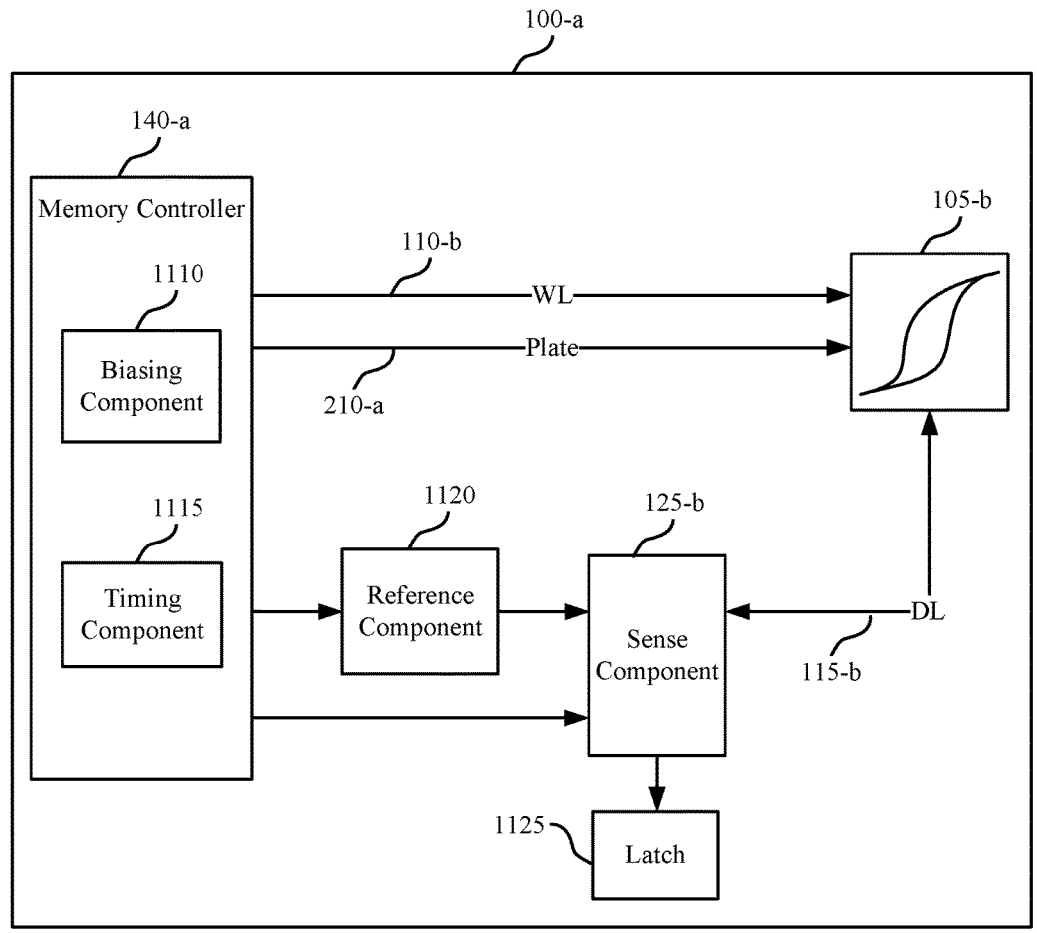
FIG. 11 shows a block diagram of a memory array that supports reducing the low voltage applied to cell plates of ferroelectric memory cells, to decrease the times to reach logic 0 write voltages for the ferroelectric memory cells, in accordance with various embodiments of the present disclosure.

FIG. 11 shows a block diagram 1100 of a memory array 100-a that supports reducing the low voltage applied to cell plates of ferroelectric memory cells, to decrease the times to reach logic 0 write voltages for the ferroelectric memory cells, in accordance with various embodiments of the present disclosure. The memory array 100-a may also provide barrel shifting-enabled cell plates for ferroelectric memory cells. Memory array 100-a may contain memory controller 140-a and memory cell 105-b, which may be examples of memory controller 140 and memory cell 105 described with reference to FIGS. 1 and 2. Memory controller 140-a may include biasing component 1110 and timing component 1115 and may operate memory array 100-a as described in one or more of FIGS. 1-10. Memory controller 140-a may be in electronic communication with word line 110-b, digit line 115-b, sense component 125-b, and cell plate 210-a, which may be examples of the word line 110, digit line 115, sense component 125, and cell plate 210 described with reference to FIGS. 1 and 2. Memory array 100-a may also include reference component 1120 and latch 1125. The components of memory array 100-a may be in electronic communication with each other and may perform the functions described with reference to one or more of FIGS. 1-10. In some cases, reference component 1120, sense component 125-b and latch 1125 may be components of memory controller 140-a.

Memory controller 140-a may be configured to activate word line 110-b, cell plate 210-a, or digit line 115-b by applying voltages to those various nodes. For example, biasing component 1110 may be configured to apply a voltage to operate memory cell 105-b (e.g., to read or write memory cell 105-b) as described above. In some cases, memory controller 140-a may include a row decoder, a column decoder, or both, as described with reference to FIG. 1. This may enable memory controller 140-a to access one or more memory cells 105-b. Biasing component 1110 may also provide voltage potentials to reference component 1120 in order to generate a reference signal for sense component 125-b. Additionally, biasing component 1110 may provide voltage potentials for the operation of sense component 125-b.

In some cases, memory controller 140-a may perform its operations using timing component 1115. For example, timing component 1115 may control the timing of the various word line selections or cell plate biasing, including the timing of switching functions and voltage applications to perform the memory functions, such as reading and writing, discussed herein. In some cases, timing component 1115 may control the operations of biasing component 1110.

Reference component 1120 may include various components to generate a reference signal for sense component 125-b. Reference component 1120 may include circuitry specifically configured to produce a reference signal. In some cases, reference component 1120 may be other ferroelectric memory cells 105. In some examples, reference component 1120 may be configured to output a voltage with a value between two sense voltages, or reference component 1120 may be designed to output a virtual ground voltage.

Sense component 125-b may compare a signal from memory cell 105-b (through digit line 115-b) with a reference signal from reference component 1120. Upon determining the logic state, the sense component may store the logic state in latch 1125, where it may be used in accordance with the operations of an electronic device using the memory device of which memory array 100-a is a part.

Figure 12:
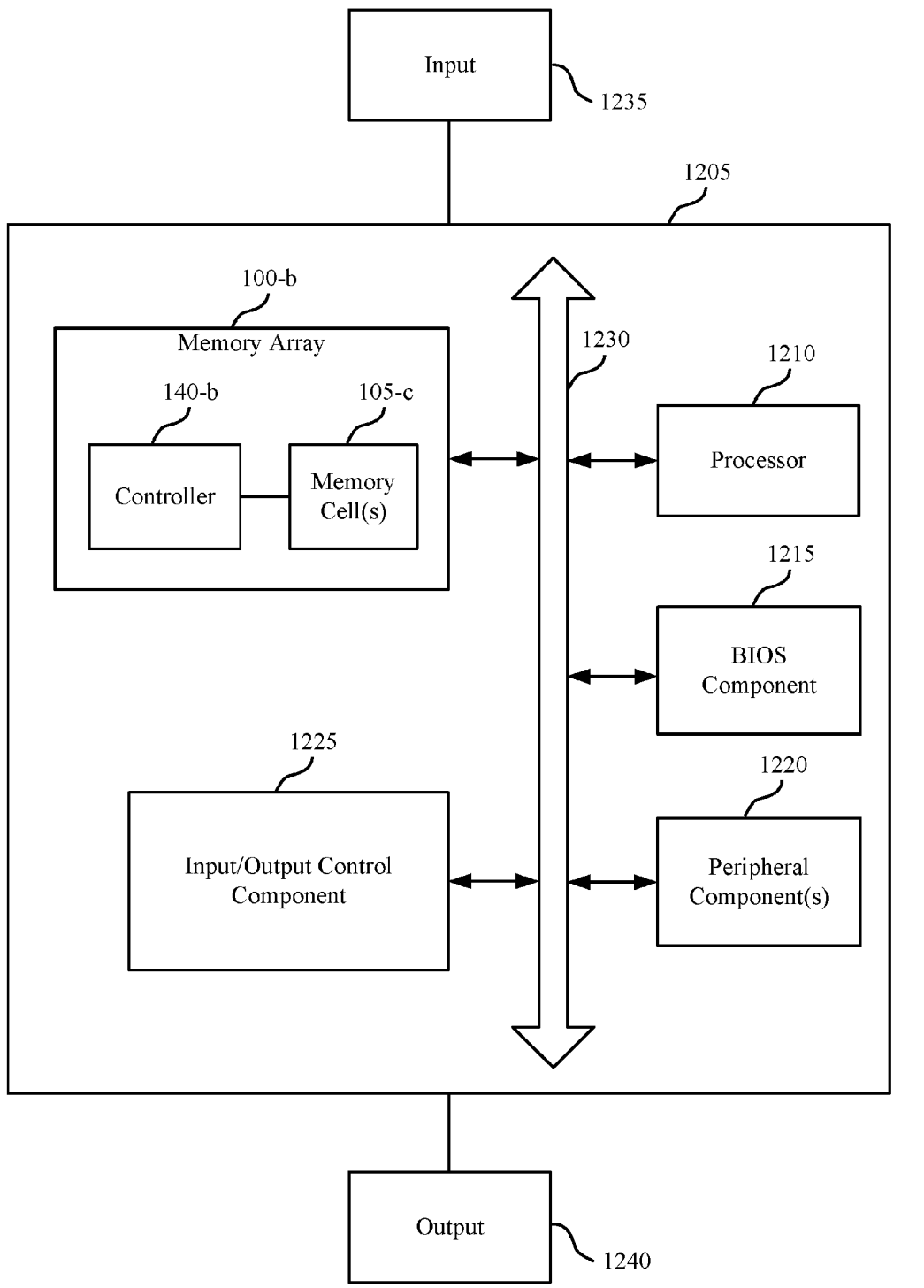
FIG. 12 shows a diagram of a system that supports reducing the low voltage applied to cell plates of ferroelectric memory cells, to decrease the times to reach logic 0 write voltages for the ferroelectric memory cells, in accordance with various embodiments of the present disclosure.

FIG. 12 shows a diagram of a system 1200 that supports reducing the low voltage applied to cell plates of ferroelectric memory cells, to decrease the times to reach logic 0 write voltages for the ferroelectric memory cells, in accordance with various embodiments of the present disclosure. The system 1200 may also provide barrel shifting-enabled cell plates for ferroelectric memory cells. System 1200 may include a device 1205, which may be or include a printed circuit board to connect or physically support various components. Device 1205 may include a memory array 100-b, which may be an example of memory array 100 described in FIGS. 1 and 11. Memory array 100-b may contain memory controller 140-b and memory cell(s) 105-c, which may be examples of the memory controller 140 described with reference to FIGS. 1 and 11 and the memory cells 105 described with reference to FIGS. 1, 2, and 11. Device 1205 may also include a processor 1210, BIOS component 1215, peripheral component(s) 1220, and input/output controller 1225. The components of device 1205 may be in electronic communication with one another through bus 1230.

Processor 1210 may be configured to operate memory array 100-b through memory controller 140-b. In some cases, processor 1210 may perform the functions of the memory controller 140 described with reference to FIG. 1 or 11. In other cases, memory controller 140-b may be integrated into processor 1210. Processor 1210 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 1210 may perform various functions described herein. Processor 1210 may, for example, be configured to execute computer-readable instructions stored in memory array 100-a to cause device 1205 to perform various functions or tasks.

BIOS component 1215 may be a software component that includes a basic input/output system (BIOS) operated as firmware, which may initialize and run various hardware components of system 1200. BIOS component 1215 may also manage data flow between processor 1210 and the various components, e.g., peripheral components 1220, input/output controller 1225, etc. BIOS component 1215 may include a program or software stored in read-only memory (ROM), flash memory, or any other non-volatile memory.

Peripheral component(s) 1220 may be any input or output device, or an interface for such devices, that is integrated into device 1205. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output controller 1225 may manage data communication between processor 1210 and peripheral component(s) 1220, input device(s) 1235, or output device(s) 1240. Input/output controller 1225 may also manage peripherals not integrated into device 1205. In some cases, input/output controller 1225 may represent a physical connection or port to the external peripheral.

Input device(s) 1235 may represent a device or signal external to device 1205 that provides input to device 1205 or its components. This may include a user interface or interface with or between other devices. In some cases, input device(s) 1235 may be a peripheral that interfaces with device 1205 via peripheral component(s) 1220 or may be managed by input/output controller 1225.

Output device(s) 1240 may represent a device or signal external to device 1205 configured to receive output from device 1205 or any of its components. Examples of output device(s) 1240 may include a display, audio speakers, a printing device, another processor or printed circuit board, etc. In some cases, output device(s) 1240 may be a peripheral that interfaces with device 1205 via peripheral component(s) 1220 or may be managed by input/output controller 1225.

The components of memory controller 140-*b*, device 1205, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating at least one ferroelectric memory cell, comprising:
   determining to write a logic value to a first ferroelectric memory cell and at least one additional ferroelectric memory cell;
   biasing a first cell plate of the first ferroelectric memory cell to a first voltage, prior to writing the logic value to the first ferroelectric memory cell, by applying a drive signal to a first cell plate driver associated with the first ferroelectric memory cell;
   biasing at least one additional cell plate of the at least one additional ferroelectric memory cell to the first voltage, prior to writing the logic value to the at least one additional ferroelectric memory cell, by activating at least one pass gate that applies the drive signal to at least one additional cell plate driver associated with the at least one additional ferroelectric memory cell, wherein the at least one pass gate is coupled with the first cell plate driver and the at least one additional cell plate driver; and
   writing the logic value to the first ferroelectric memory cell and the at least one additional ferroelectric memory cell.

2. The method of claim 1, wherein activating the at least one pass gate comprises:
   activating a first pass gate when the at least one additional ferroelectric memory cell comprises a second ferroelectric memory cell; and
   activating a second pass gate when the at least one additional ferroelectric memory cell comprises a third ferroelectric memory cell.

3. The method of claim 2, wherein activating the first pass gate enables a first barrel shift of data and activating the second pass gate enables a second barrel shift of data different than the first barrel shift of data.

4. The method of claim 1, further comprising:
   biasing the first cell plate of the first ferroelectric memory cell to a second voltage before biasing the first cell plate of the first ferroelectric memory cell to the first voltage.

5. The method of claim 1, wherein biasing the at least one additional cell plate of the at least one additional ferroelectric memory cell to the first voltage comprises:
   selecting a data storage element associated with the at least one additional cell plate; and
   operating the data storage element based at least in part on selecting the data storage element, wherein the operating of the data storage element temporarily biases the at least one additional cell plate to the first voltage.

6. A method of operating at least one ferroelectric memory cell, comprising:
   determining to write a logic value to a first ferroelectric memory cell and at least one additional ferroelectric memory cell;
   biasing a first cell plate of the first ferroelectric memory cell to a first voltage, prior to writing the logic value to the first ferroelectric memory cell, by applying a drive signal to a first cell plate driver associated with the first ferroelectric memory cell;
   biasing at least one additional cell plate of the at least one additional ferroelectric memory cell to the first voltage, prior to writing the logic value to the at least one additional ferroelectric memory cell, by activating at least one pass gate that applies the drive signal to at least one additional cell plate driver associated with the at least one additional ferroelectric memory cell;

writing the logic value to the first ferroelectric memory cell and the at least one additional ferroelectric memory cell; and biasing the first cell plate of the first ferroelectric memory cell to a second voltage before biasing the first cell plate of the first ferroelectric memory cell to the first voltage, wherein biasing the first cell plate to the second voltage is performed in a same operation as biasing the at least one additional cell plate of the at least one additional ferroelectric memory cell to the first voltage.

7. The method of claim 6, wherein biasing the first cell plate to the second voltage comprises operating a data storage element.

8. A method of operating at least one ferroelectric memory cell, comprising:

determining to write a logic value to a first ferroelectric memory cell and at least one additional ferroelectric memory cell;

biasing a first cell plate of the first ferroelectric memory cell to a first voltage, prior to writing the logic value to the first ferroelectric memory cell, by applying a drive signal to a first cell plate driver associated with the first ferroelectric memory cell;

biasing at least one additional cell plate of the at least one additional ferroelectric memory cell to the first voltage, prior to writing the logic value to the at least one additional ferroelectric memory cell, by activating at least one pass gate that applies the drive signal to at least one additional cell plate driver associated with the at least one additional ferroelectric memory cell;

writing the logic value to the first ferroelectric memory cell and the at least one additional ferroelectric memory cell;

biasing the first cell plate of the first ferroelectric memory cell to a second voltage before biasing the first cell plate of the first ferroelectric memory cell to the first voltage; and applying the first voltage to the at least one additional cell plate driver from a negative voltage source.

9. The method of claim 8, wherein the first voltage is applied through a negative word line coupled with the first ferroelectric memory cell.

10. An electronic memory apparatus, comprising:

a plurality of ferroelectric memory cells comprising a first ferroelectric memory cell and a second ferroelectric memory cell, wherein each of the plurality of ferroelectric memory cells comprises a memory cell selection component coupled to a first terminal of a ferroelectric capacitor;

a plurality of cell plate drivers, including a first cell plate driver associated with the first ferroelectric memory cell and a second cell plate driver associated with the second ferroelectric memory cell, wherein each of the plurality of cell plate drivers is operable to switch a cell plate of one of a plurality of ferroelectric capacitors between a first voltage and a second voltage;

at least one pass gate comprising a first pass gate, wherein the first pass gate is coupled with the first cell plate driver and the second cell plate driver; and a controller operable to:

supply a drive signal to the first cell plate driver to bias a first cell plate of the first ferroelectric memory cell to the second voltage; and operate the first pass gate to selectively supply the drive signal to the second cell plate driver to bias a second cell plate of the second ferroelectric memory cell to the second voltage.

11. The electronic memory apparatus of claim 10, wherein the plurality of ferroelectric memory cells further comprises a third ferroelectric memory cell, the plurality of cell plate drivers comprises a third cell plate driver associated with the third ferroelectric memory cell, and the at least one pass gate comprises a second pass gate, wherein the controller is operable to:

operate the second pass gate to selectively supply the drive signal to the third cell plate driver to bias a third cell plate of the third ferroelectric memory cell to the second voltage.

12. The electronic memory apparatus of claim 11, wherein the controller is operable to:

operate the first pass gate and the second pass gate to supply the drive signal to the second cell plate driver or the third cell plate driver during a write operation of the first ferroelectric memory cell.

13. The electronic memory apparatus of claim 12, wherein operating the first pass gate enables a data shift in a first direction and operating the second pass gate enables a data shift in a second direction different than the first direction.

14. The electronic memory apparatus of claim 13, wherein the first direction and the second direction are opposite directions.

15. The electronic memory apparatus of claim 10, wherein the first cell plate driver comprises at least a first transistor, and wherein the controller is operable to:

drive a first gate of the first transistor to bias the first cell plate to the first voltage.

16. The electronic memory apparatus of claim 10, wherein the first voltage comprises a negative voltage, wherein the controller is further operable to:

obtain the first voltage from a voltage source selected from a negative word line voltage source or a bulk bias voltage source.

17. An electronic memory apparatus, comprising:

a first ferroelectric memory cell coupled with a first digit line and comprising a first cell plate;

a first cell plate driver coupled with the first ferroelectric memory cell and a first pass gate;

a second ferroelectric memory cell coupled with a second digit line and comprising a second cell plate;

a second cell plate driver coupled with the second ferroelectric memory cell and a second pass gate, wherein the second pass gate is coupled with the first cell plate driver and the second cell plate driver; and a controller coupled with the first digit line and the second digit line, the controller operable to:

determine to write a logic value to the first ferroelectric memory cell and the second ferroelectric memory cell;

bias the first cell plate to a first voltage, prior to writing the logic value to the first ferroelectric memory cell, by applying a drive signal to the first cell plate driver;

bias the second ferroelectric memory cell to the first voltage, prior to writing the logic value to the second ferroelectric memory cell, by activating the second pass gate to apply the drive signal to the second cell plate driver; and write the logic value to the first ferroelectric memory cell and the second ferroelectric memory cell.

18. The electronic memory apparatus of claim 17, wherein the controller is further operable to:

cause a data shift in a first direction by activating the first pass gate; and cause a data shift in a second direction different than the first direction by activating the second pass gate.

19. The electronic memory apparatus of claim 17, wherein the controller is further operable to:
   apply the first voltage from a voltage source selected from a group consisting of a negative word line voltage source and a bulk bias voltage source.

20. The electronic memory apparatus of claim 17, wherein the first voltage comprises a positive voltage.

* * * * *